(12) United States Patent
Clark et al.

(10) Patent No.: US 8,122,317 B1
(45) Date of Patent: Feb. 21, 2012

(54) TWO-DIMENSIONAL PARITY TECHNIQUE TO FACILITATE ERROR DETECTION AND CORRECTION IN MEMORY ARRAYS

(75) Inventors: Lawrence T. Clark, Phoenix, AZ (US); Karl C. Mohr, Phoenix, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 908 days.

(21) Appl. No.: 12/163,640

(22) Filed: Jun. 27, 2008

Related U.S. Application Data

(60) Provisional application No. 60/946,696, filed on Jun. 27, 2007.

(51) Int. Cl.
*H03M 13/00* (2006.01)
(52) U.S. Cl. ........................................ 714/758; 714/752
(58) Field of Classification Search .................. 714/752, 714/758
See application file for complete search history.

(56) References Cited

U.S. PATENT DOCUMENTS

| | | | |
|---|---|---|---|
| 6,185,718 B1 * | 2/2001 | Dell et al. ..................... | 714/800 |
| 6,838,899 B2 | 1/2005 | Plants | |
| 6,990,010 B1 | 1/2006 | Plants | |
| 7,036,059 B1 | 4/2006 | Carmichael et al. | |
| 2004/0117723 A1 | 6/2004 | Foss | |
| 2005/0028067 A1 * | 2/2005 | Weirauch ..................... | 714/758 |
| 2006/0036909 A1 | 2/2006 | VanBuren | |
| 2007/0150791 A1 * | 6/2007 | Gross et al. .................... | 714/763 |

OTHER PUBLICATIONS

Ronald C. Lacoe, et al., "Application of Hardness-By-Design Methodology to Radiation-Tolerant ASIC Technologies", pp. 2334-2341, IEEE Transactions on Nuclear Science, vol. 47, No. 6, Dec. 2000.
T. Calin, et al., "Upset Hardened Memory Design for Submicron CMOS Technology", pp. 2874-2878, IEEE Transactions on Nuclear Science, vol. 43, No. 6, Dec. 1996.
Matthew J. Gadlage, et al., "Single Event Transient Pulsewidths in Digital Microcircuits", pp. 3285-3290, IEEE Transactions on Nuclear Science. vol. 51, No. 6, Dec. 2004.
David G. Mavis et al., "Soft Error Rate Mitigation Techniques for Modern Microcircuits", pp. 216-225, IEEE Reliability Physics Symposium, Dallas, Texas, 2002.
M.Y. Hsiao, "A Class of Optimal Minimum Odd-weight-column SEC-DED Codes", pp. 395-401, IBM J. Res. Development, vol. 14, Jul. 1970.
C.L. Chen, et al., "Error-Correcting Codes fro Semiconductor Memory Applications: A State-of-the-Art Review", pp. 124-134, IBM J. Res. Development, vol. 28, No. 2, Mar. 1984.

(Continued)

*Primary Examiner* — Sam Rizk
(74) *Attorney, Agent, or Firm* — Withrow & Terranova, P.L.L.C.

(57) ABSTRACT

The present invention is directed to a two-dimensional parity technique for data to be stored in one or more memory arrays, each of which has various rows and columns of cells. A row of bits in a super bundle is referred to as a row bundle. A super bundle includes numerous rows of row bundles, and corresponding bits in each of the row bundles in the super bundle are aligned in columns. A row check bit is provided for each row bundle in each super bundle. Each row check bit provides a parity bit that is derived from the k bits of the corresponding row bundle. A column check bit is provided for each column in each super bundle. Each column check bit provides a parity bit that is derived from each of the bits in the corresponding column in the super bundle.

25 Claims, 19 Drawing Sheets

OTHER PUBLICATIONS

Peter Calingaert, "Two-Dimensional Parity Checking", pp. 186-200, J. of the ACM, vol. 8, 1961.

Morris Rubinoff, "N-Dimensional Codes for Detecting and Correcting Muitiple Errors", pp. 545-551, Communications of the ACM, vol. 4, Dec. 1961.

Karl C. Mohr, et al., "Delay and Area Efficient First-level Cache Soft Error Detection and Correction", Proc. IEEE Int. Conf. on Computer Design, Aug. 2006.

Lawrence T. Clark, et al., "An Embedded 32-b Microprocessor Core for Low-Power and High Performance Applications", pp. 1599-1608, IEEE Journal of Solid-State Circuits, vol. 36, No. 11, Nov. 2001.

L. Jacunski, et al., "SUE Immunity: The Effects of Scaling on the Peripheral Circuits of SRAMs", pp. 2272-2276, IEEE Transaction on Nuclear Science, vol. 41, No. 6, Dec. 1994.

Quming Zhou, et al., "Gate Sizing to Radiation Harden Combinational Logic", pp. 155-166, IEEE Transactions on Computer-Aided design of Integrated Circuits and Systems, vol. 25, No. 1, Jan. 2006.

Jose Maiz, et al., "Characterization of Multi-bit Soft Error events in advanced SRAMs", pp. 945-948, IEDM Tech. Dig., Dec. 2004.

Kevin Zhang, et al., "Methods for Reducing Soft Errors in Deep Submicron Integrated Circuits", pp. 516-519, Proc. 5th Int. Conf. on Solid-state and Integrated Circ. Tech., Oct. 1998.

Kenichi Osada, et al., "16.7-fA/Cell Tunnel-Leakage-Suppressed 16-Mb SRAM for Handling Cosmic-Ray-Induced Multierrors", pp. 1952-1957, IEEE Journal of Solid-State Circuits, vol. 38, No. 11, Nov. 2003.

Tanay Karnik, et al., "Selective Node Engineering or Chip-Level Soft Error rate Improvement" pp. 204-205, VLSI Circuits Symposium Dig. of Tech., 2002.

J.J. Wang, et al., "SRAM Based Re-programmable FPGA for Space Applications", pp. 1728-1735, IEEE Transactions on Nuclear Science, vol. 46, No. 6, Dec. 1999.

Robert Baumann, "The Impact of Technology Scaling on Soft Error Rate Performance and Limits to the Efficacy of Error Correction", pp. 329-332, IEDM Tech Dig., 2002.

H. Kobayashi, et al., "Comparison Between Neutron-Induced System-SER and Accelerated-SER in SRAMs", pp. 288-293, Proc. IRPS, 2004.

D. Lambert, et al, "Neutron-Induced SEU in Bulk SRAMs in Terrestrial Environment: Simulations and Experiments", pp. 3435-3441, IEEE Transactions on Nuclear Science, vol. 15, No. 6, Dec. 2004.

Thomas Granlund, et al., "Soft Error Rate Increase for New Generations of SRAMs", pp. 2065-2068, IEEE Transactions on Nuclear Science, vol. 50, No. 6, Dec. 2003.

AMD Opteron Processor Product Data Sheet, http://www.amd.com, Jun. 2004.

Intel Pentium Processor Extreme Edition Datasheet, http://intel.com, Oct. 2005.

J.M. Tendler, et al., "POWER4 system microarchitecture", pp. 5-25, IBM J. Res. & Dev., vol. 46, No. 1, Jan. 2002.

Norbert Seifert, et al., "Historical Trend in Alpha-Particle induced Soft Error Rates of the Alpha Microprocessor", pp. 259-265, Proc. IRPS, 2001.

Franco Ricci, et al., "A 1,5 GHz 90 nm Embedded Microprocessor Core", pp. 12-15, Symposium VLSI Cir. Dig., 2005.

Lawrence T. Clark, et al., "Standby Power Management for a 0.18um Microprocessor", pp. 7-12, Proc. ISLPED, Aug. 2002.

Karl C. Mohr, et al., "A Radiation Hardened by design Register File With Lightweight Error Detection and Correction", pp. 1335-1342, IEEE Transactions on Nuclear Science, vol. 54, No. 4, Aug. 2007.

J. Schwank, "Total-Dose Effects in MOS Devices", Section III pp. 1-123; 2002 IEEE NSREC Short Course Notebook, Jul. 2002.

R. Lacoe, "CMOS Scaling, Design Principles and Hardening-By-Design Methodologies", Section II pp. 1-135, 2003 IEEE NSREC Short Course Notebook, Jul. 2003.

Website http://cyclotron.lbl.gov/subpage2.html.

* cited by examiner

```
                    COL
             0    1    2    3   CR_ROW

0  |  0  | 0  | 0  | 0  | 0 |
       1  |  0  | 0  | 0  | 0  | 0 |
ROW    2  |  0  | 0  | 0  | 0  | 0 |
       3  |  0  | 0  | 0  | 0  | 0 |
   CC_COL |  0  | 0  | 0  | 0  | 0 |
```

= DATA BITS     = CHECK BITS

TWO-DIMENSIONAL PARITY TECHNIQUE TO FACILITATE ERROR DETECTION AND CORRECTION IN MEMORY ARRAYS

This application claims the benefit of U.S. provisional application Ser. No. 60/946,696 filed Jun. 27, 2007, the disclosure of which is incorporated herein by reference in its entirety.

GOVERNMENT FUNDING

This invention was made with government support under grant number F29601-02-2-299, awarded by the Air Force Research Laboratory. The United States Government may have certain rights in this invention.

FIELD OF THE INVENTION

The present invention relates to a two-dimensional parity technique to facilitate error detection and correction in memory arrays.

BACKGROUND OF THE INVENTION

Microprocessors rely on instructions and data, which are stored in various types of memory, for operation. The integrity of the instructions and data is imperative for proper operation. An error in a single bit of the instructions or data may lead to operation errors ranging from an errant function to a complete malfunction. Accordingly, efforts are often taken to ensure the integrity of the data by checking for errors before the data is used. A common error detection technique employs a parity bit for every x number of bits. For example, each byte of data may be associated with a parity bit. The value of the parity bit is calculated based on the values of each bit in the byte and is stored in association with the byte. Assuming single bytes may be written at any given time, each time the byte is written, a new parity bit value is calculated and stored in the parity bit. Each time the byte is read, the values in each bit of the byte are used to generate a new parity value, which is then compared to the parity value stored in the parity bit. If the new parity value and the parity value stored in the parity bit do not match, at least one of the values of the bits in the byte is in error.

Such parity schemes are relatively easy and efficient to implement, as the extra memory and processing resources required to implement parity checking is relatively low. Unfortunately, basic parity schemes only allow for the detection of errors and do not allow for the correction of errors. As such, parity schemes are generally used for data that is normally stored in multiple locations, such that when an error is detected for data in one location, an error free version of the data can be obtained from the other location.

When errors in data must be corrected, error detection and correction (EDAC) techniques may be employed. EDAC techniques generally employ error correction codes (ECC), such as the Hamming or Hsiao codes described in M. Hsiao, "A Class of Optimal Minimum Odd-weight-column SEC-DEC Codes", IBM J. Res. Dev., 14, pp. 395-401, July 1970, and C. Chen et al., "Error-Correcting Codes for Semiconductor Memory Applications: A State-of-the-Art Review", IBM J. Res. & Dev., 28, 2, pp. 124-134, March 1984, which are incorporated herein by reference in their entireties. In an ECC scheme, r values for the check bits are calculated and stored in association with every bundle of z data bits during write operations. For read operations, the check bits generally allow the detection of single- or double-bit errors and the correction of single-bit errors. An exemplary read operation may flow as follows. Initially, the values of data bits are read and used to calculate new check bit values, which are logically exclusive-ORed with the corresponding values stored in the check bits to generate an r bit syndrome. If the values of the syndrome are all logic 0s, the data is valid. If any value of the syndrome is a logic 1, the data is corrupted. The nature of ECCs allows single-bit errors to be corrected and multiple-bit errors to be detected.

An example of data and check bit storage is provided in FIG. 1. An N×32 bit array 12 is illustrated where each bundle of 32 bits represents a row of data, which is associated with the required seven check bits. As illustrated, the number of check bits required for each bundle is inefficient and creates a significant penalty in the memory required to implement this EDAC scheme. A processing penalty is also imposed, as the large number of check bits for a bundle must be calculated each time a bundle is written. Partial, or narrow, writes require essentially the same amount of processing as a complete write. A partial write is one in which only a portion of the bundle is rewritten, such as when only an eight-bit byte is written within the 32-bit bundle. For a partial write, the entire 32-bit bundle is read. The eight-bit byte to be written is inserted into the bundle, and updated check bit values are calculated based on the entire bundle. The updated check bit values are then stored in the associated check bits.

Although conventional EDAC schemes are very effective, the processing and area penalties associated with their use limit their application. As such, usually only larger memories and second level (Layer 2) cache in high performance processor applications employ EDAC schemes. These performance penalties generally preclude the use of EDAC schemes in register files, and limit the application of EDAC schemes in first level (Layer 1) caches. As such, many processor applications are forced to rely on parity schemes, and if EDAC schemes are employed, they are only used for memories where processor overhead, access speeds, and overall size are of limited importance.

Bit errors in memory may be attributed to any number of causes. One of the more difficult causes to guard against is radiation. Electronic circuits, and in particular memory circuits, are vulnerable to high-energy sub-atomic particles and other types of electromagnetic radiation. Many high-altitude flight, outer space, military, nuclear, and various commercial applications require that such vulnerability be reduced to an acceptable level. Employing techniques to reduce the vulnerability of these circuits to the effects of radiation is generally referred to as radiation hardening. For the most part, radiation hardening involves employing special circuit designs, circuit layouts, the use of select materials, or any combination thereof to increase the robustness of the circuit. Long-term radiation effects that may impact the long-term functionality of the circuit are referred to as total ionizing dose (TID) effects and are often mitigated using special semiconductor material and layer organization techniques.

Another type of radiation effect that is becoming more of an issue is referred to as a single event effect (SEE). When a high-energy particle passes through a semiconductor providing the electronic circuit, excess charge may be left in the semiconductor along the path through which the particle passes. If excess charge is left on or near a node that is charged to a level representing a desired logic state, the excess charge may change the level of charge at the node. The change in charge level may result in the node changing from the desired logic state to another logic state.

For example, if a particle of ionizing radiation passes through a circuit node that is charged for a logic 1, excess electrons from the ionizing particle track may collect at the storage node and discharge the storage node to a charge level corresponding to a logic 0. The effect of the change in charge level of the storage node may result in a temporary transient, where the storage node returns to the charge level for a logic 1 and does not upset the overall output of the of the electronic circuit. This type of SEE is referred to as a single event transient (SET). If the effect of the change in charge level of the circuit node changes the logical state of the circuit by affecting a storage node, where the storage node does not return to the proper state, a single event upset (SEU) is said to occur. Generally, SETs and SEUs are temporary, unlike TID effects, which are long-term radiation effects.

EDAC schemes may be employed to detect and correct certain bit errors caused from radiation effects. However, such schemes are limited in the number of bit errors that can be corrected for a given word or portion of a word. Without adequate radiation hardening, a radiation event may result in more bit errors than the EDAC scheme is capable of detecting, let alone correcting. Accordingly, there is a need for an EDAC scheme that is significantly more efficient than conventional EDAC schemes. For environments subjected to radiation, there is also a need for an efficient and effective EDAC scheme that is conducive to radiation hardening. There is a further need for an EDAC scheme that can be efficiently applied in first level caches, register files, and other memories used in high performance applications, especially memories that must support finer granularity, e.g., byte width writes.

SUMMARY OF THE INVENTION

The present invention is directed to a two-dimensional parity technique for data to be stored in one or more memory arrays, each of which has various rows and columns of cells. In normal use, words of any size are written into the array. Each word is broken into to a k bit bundle. Bundles of different words are associated with each other in a super bundle. Each bundle represents a row in a super bundle and is referred to as a row bundle. Accordingly, a super bundle includes numerous rows of row bundles, and corresponding bits in each of the row bundles in the super bundle are aligned in k columns.

A row check bit is provided for each row bundle in each super bundle. Each row check bit provides a parity bit that is derived from the k bits of the corresponding row bundle. In one embodiment, the row check bit is derived from taking the logical exclusive-OR (XOR) of each of the bits in the corresponding row bundle. A column check bit is provided for each column in each super bundle. Each column check bit C provides a parity bit that is derived from each of the bits in the corresponding column in the super bundle. As such, each column check bit is based on a corresponding bit from the different row bundles in the super bundle. In one embodiment, the column check bit CR is derived from taking the exclusive-OR of each of the bits in the corresponding column. The various bits in the super bundles are mapped to the cells of the memory array. The row check bits and the column check bits are mapped to cells in the same or different memory array.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 7A:
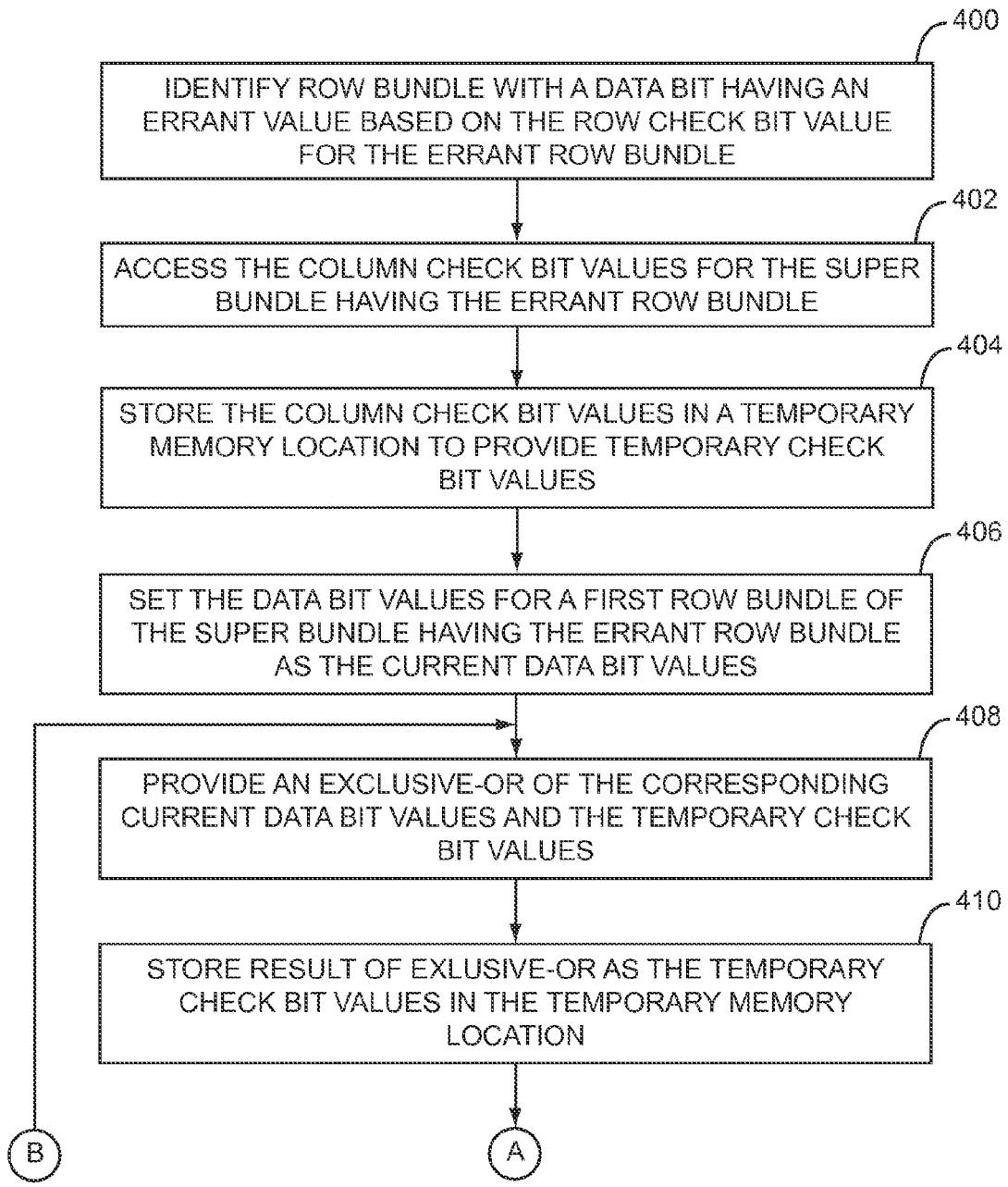
Figure 7B:
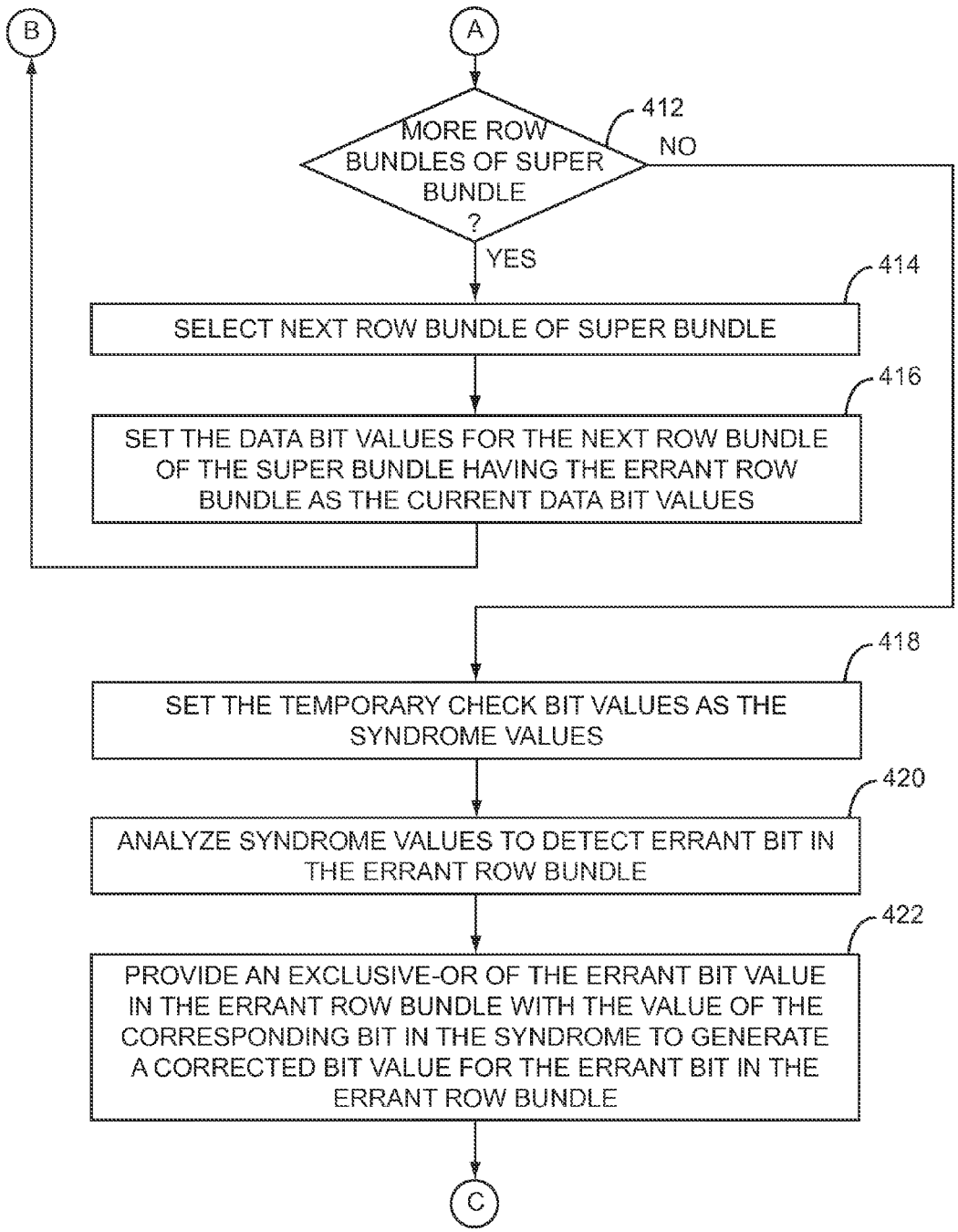
Figure 7C:
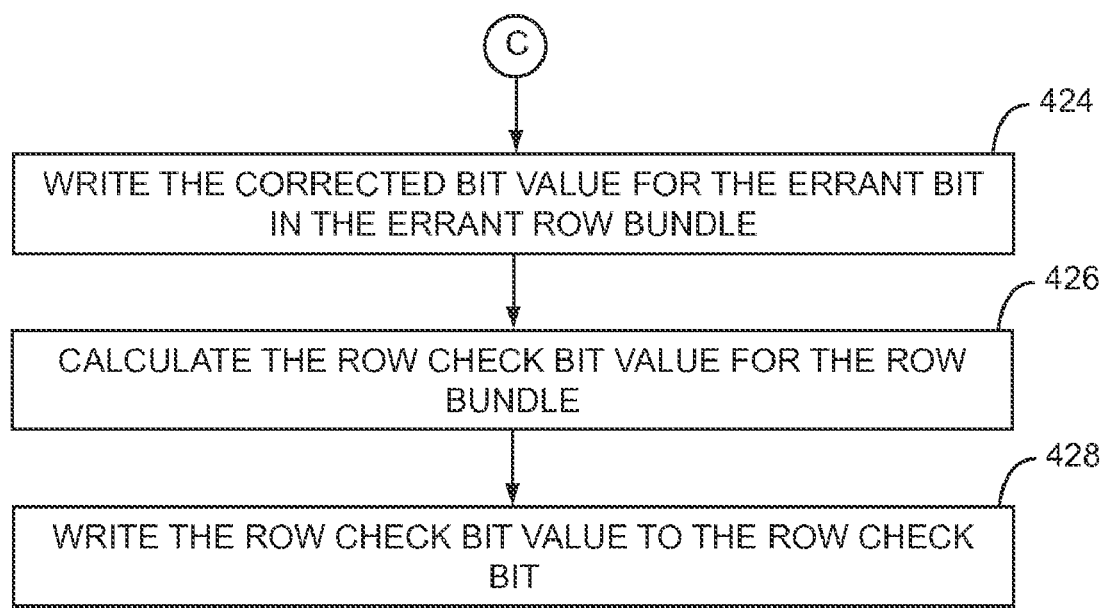

FIGS. 7A-7C contain a flow diagram illustrating a detailed error correction process according to one embodiment of the present invention.

Figure 8:
Figure 8:

FIG. 8 illustrates a simple super bundle according to one embodiment of the present invention.

Figure 9A:
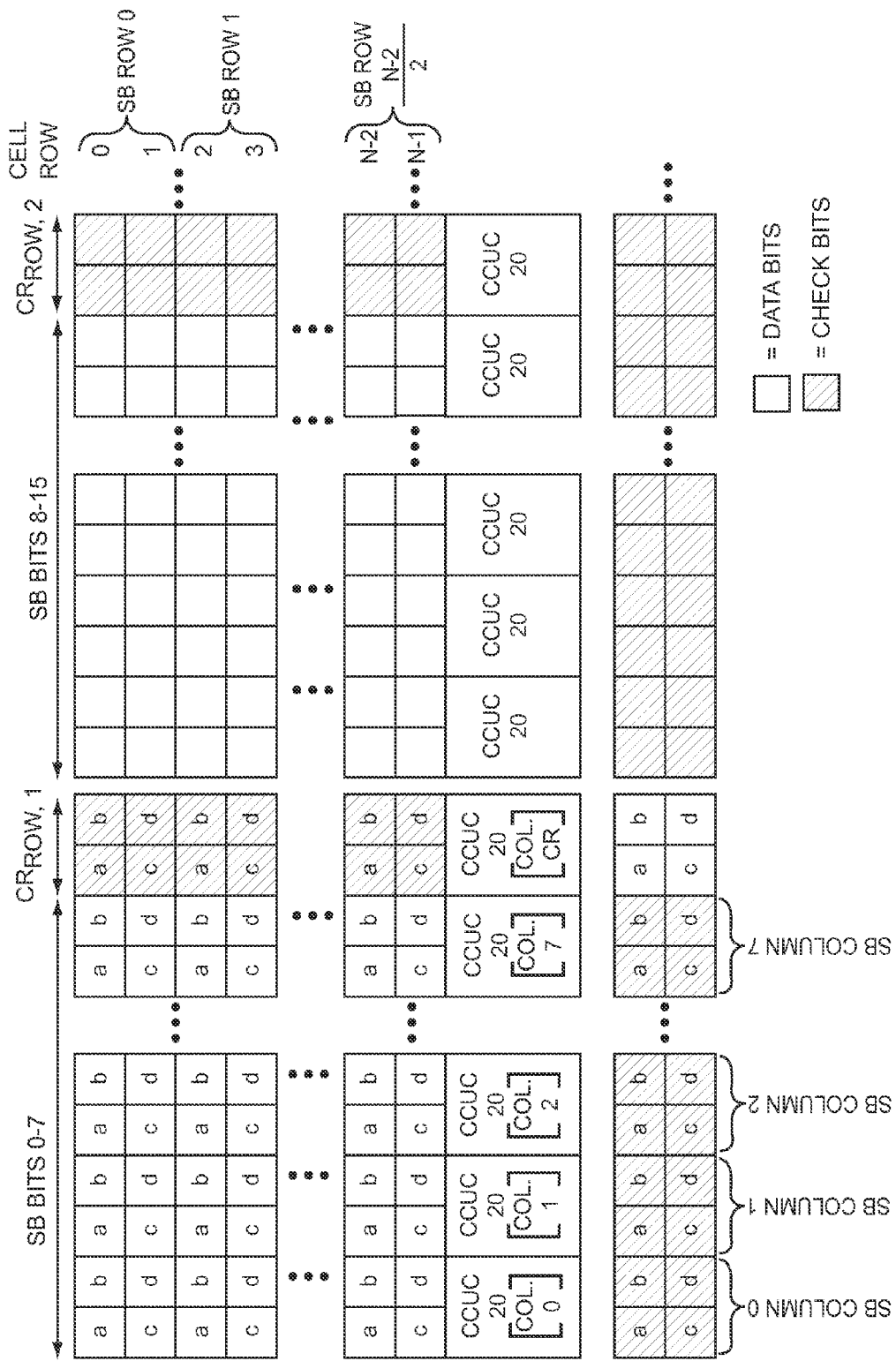
Figure 9B:
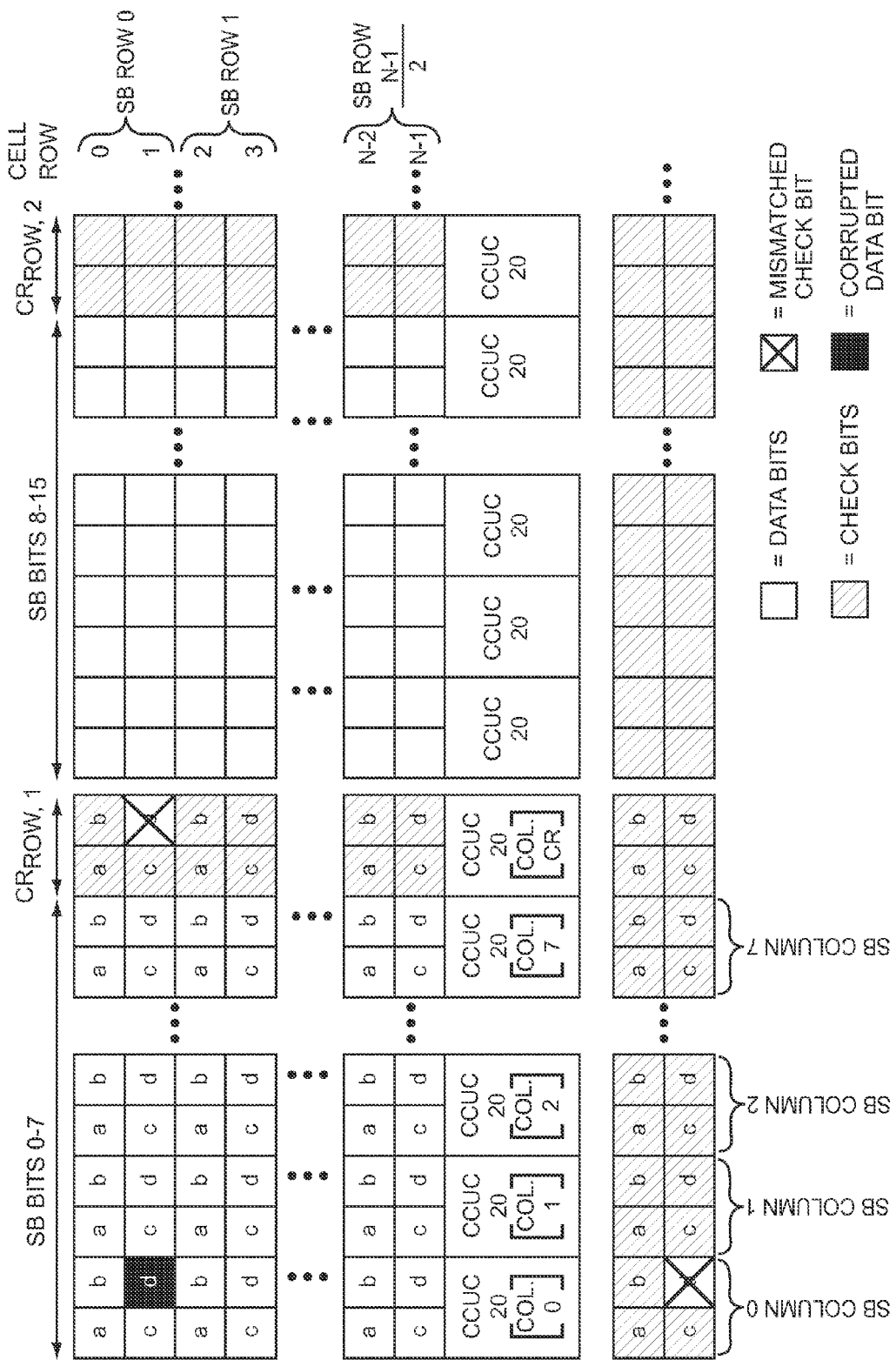

FIGS. 9A and 9B illustrate a memory array employing error detection and correction techniques according to another embodiment of the present invention.

Figure 10:
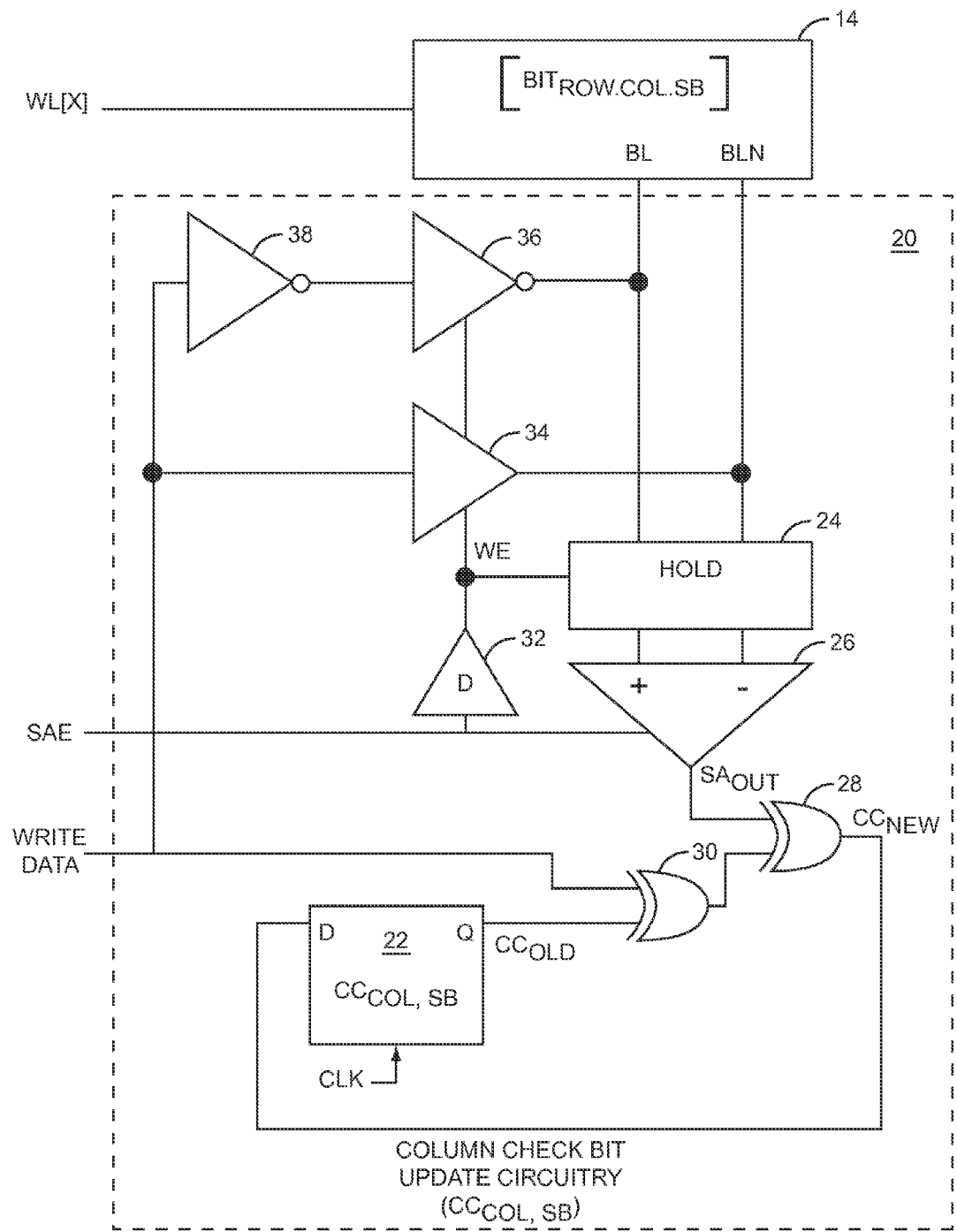

FIG. 10 is a block representation of column check bit update circuitry according to one embodiment of the present invention.

Figure 11:
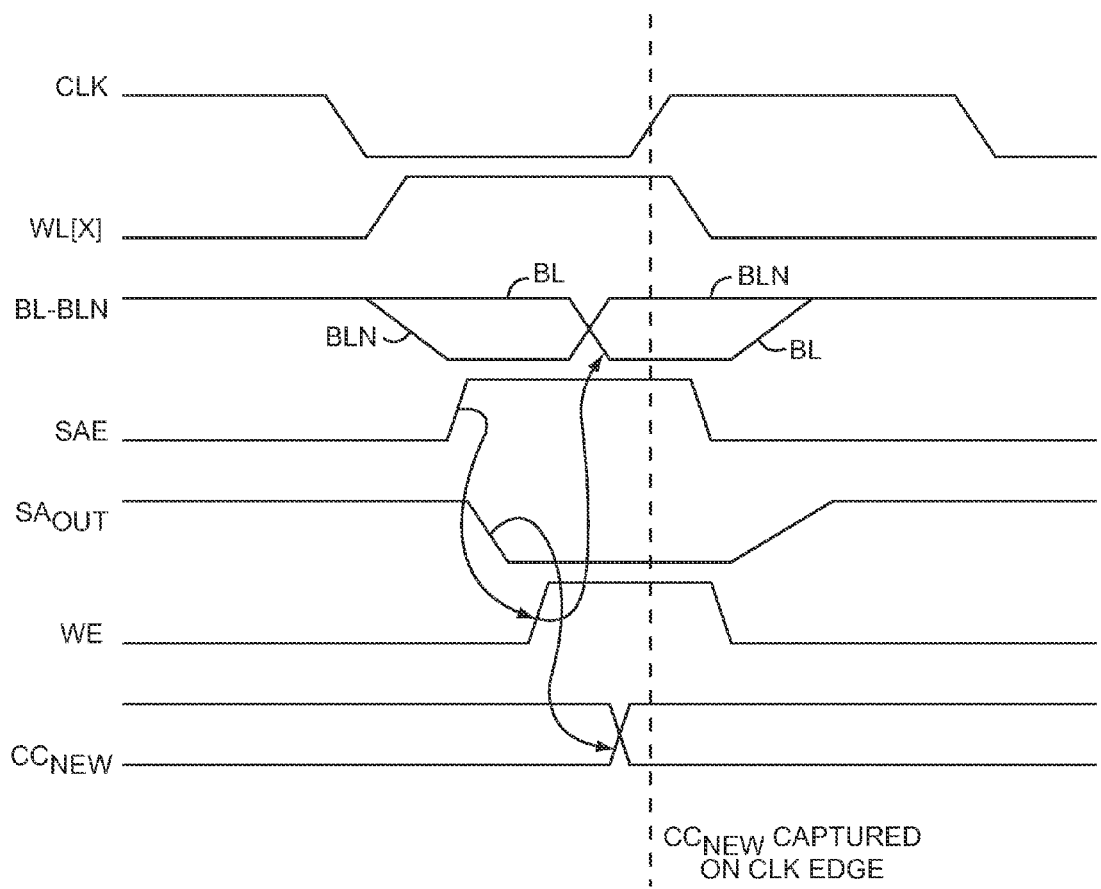

FIG. 11 is a timing diagram associated with the circuitry illustrated in FIG. 10.

Figure 12A:
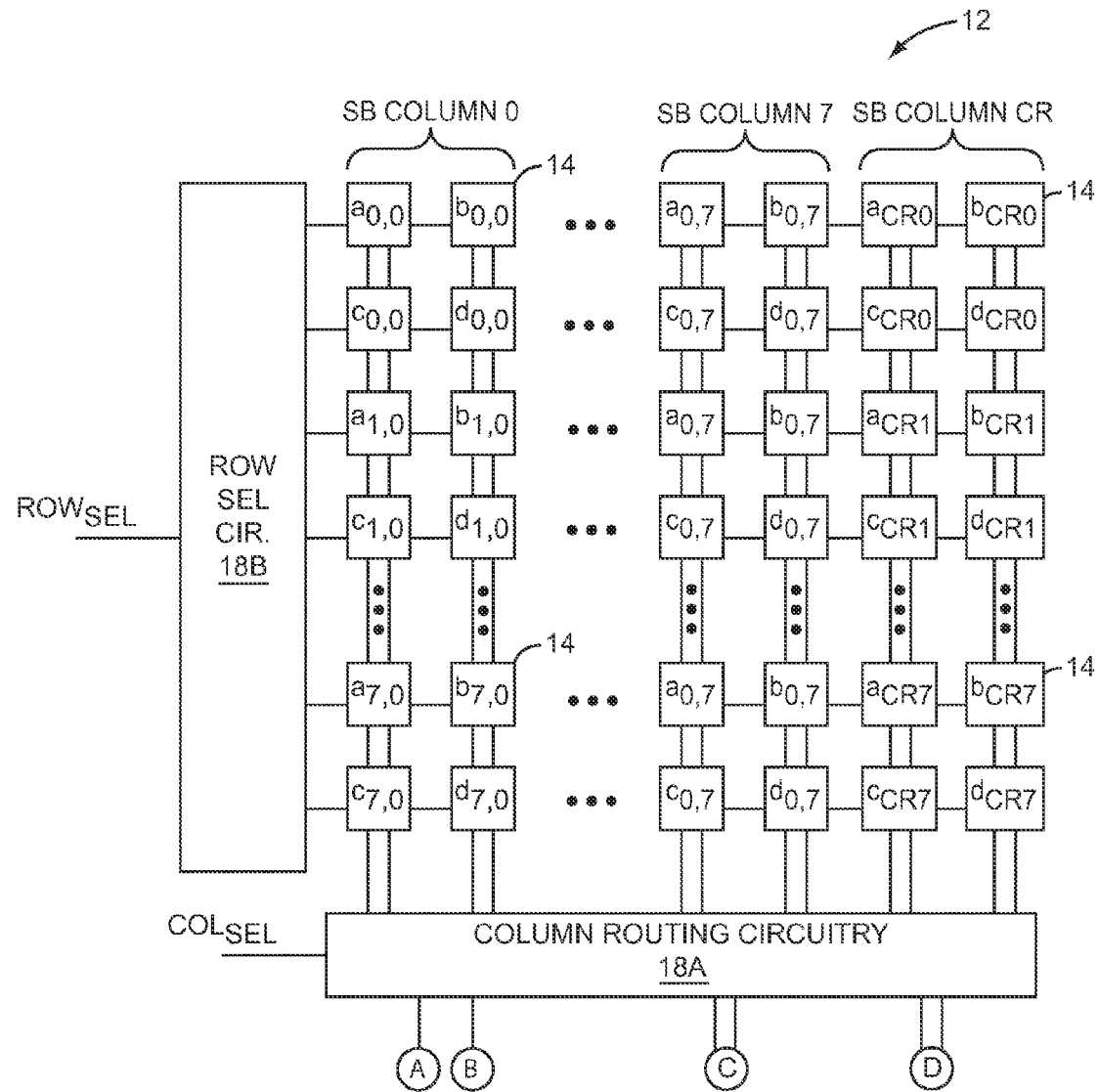
Figure 12B:
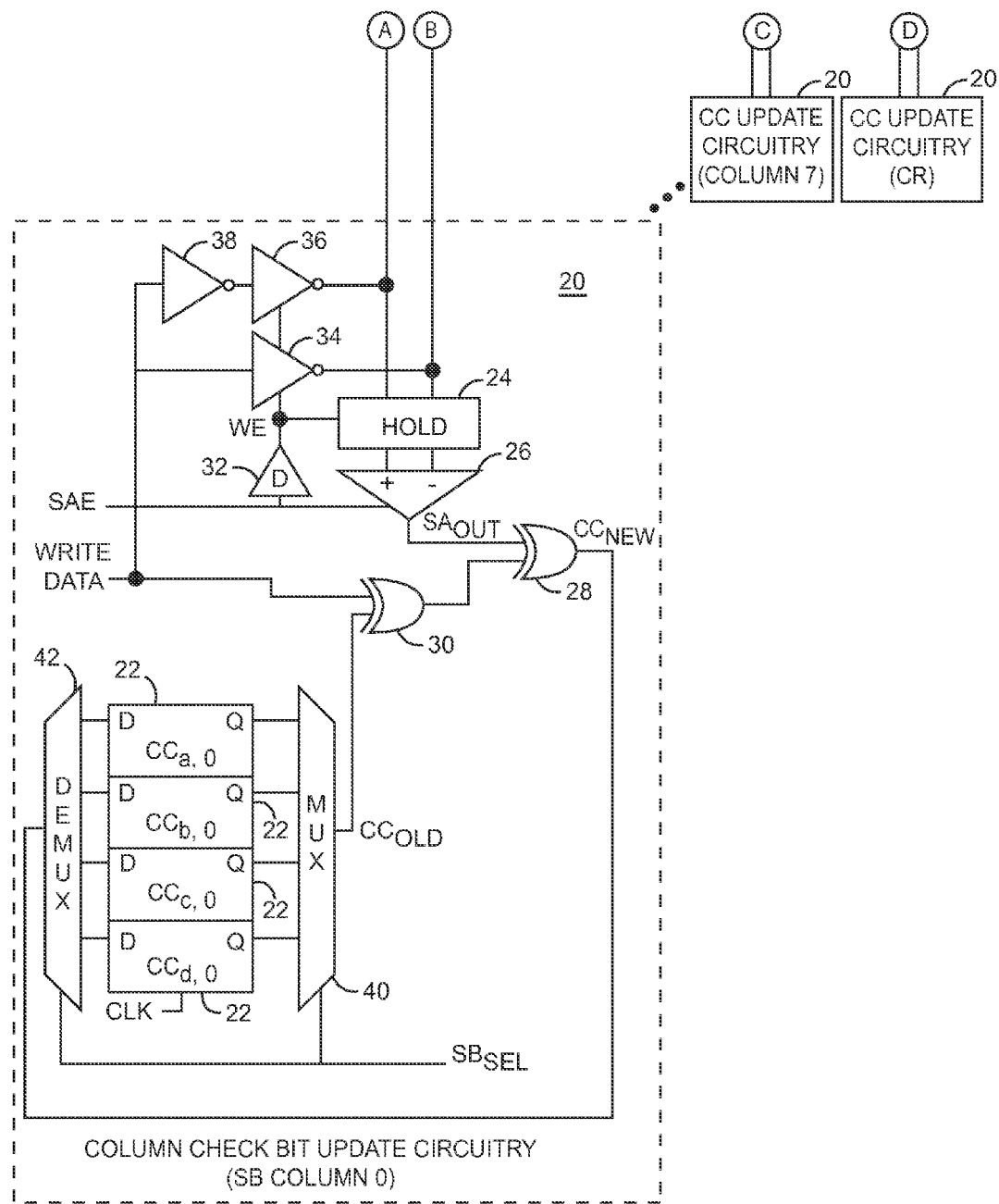

FIGS. 12A and 12B contain a block representation of a radiation-hardened memory array in association with column check bit update circuitry according to one embodiment of the present invention.

Figure 13:
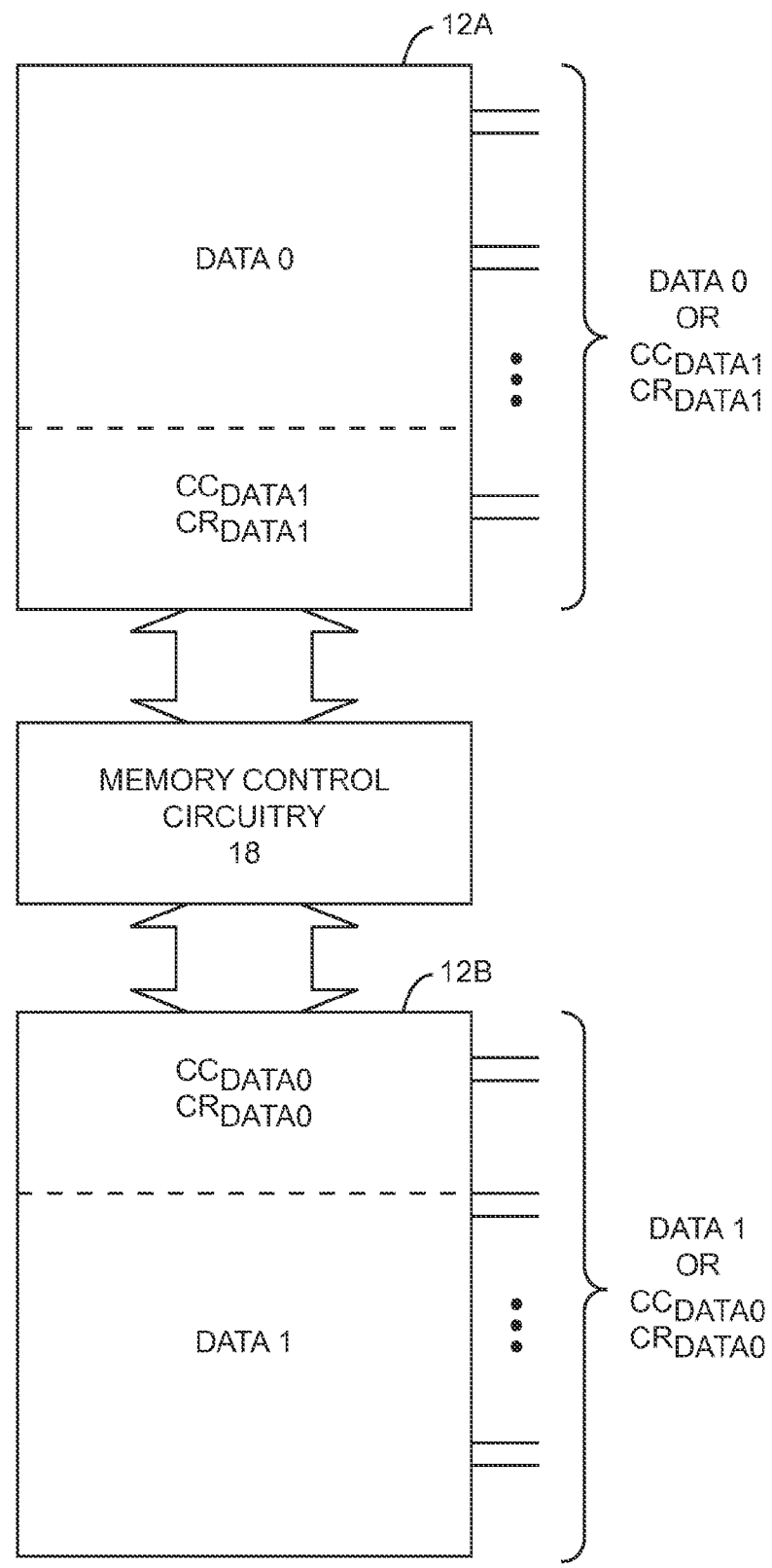

FIG. 13 is a block representation of the partitioning of data and associated row and column check bits according to one embodiment of the present invention.

Figure 14:
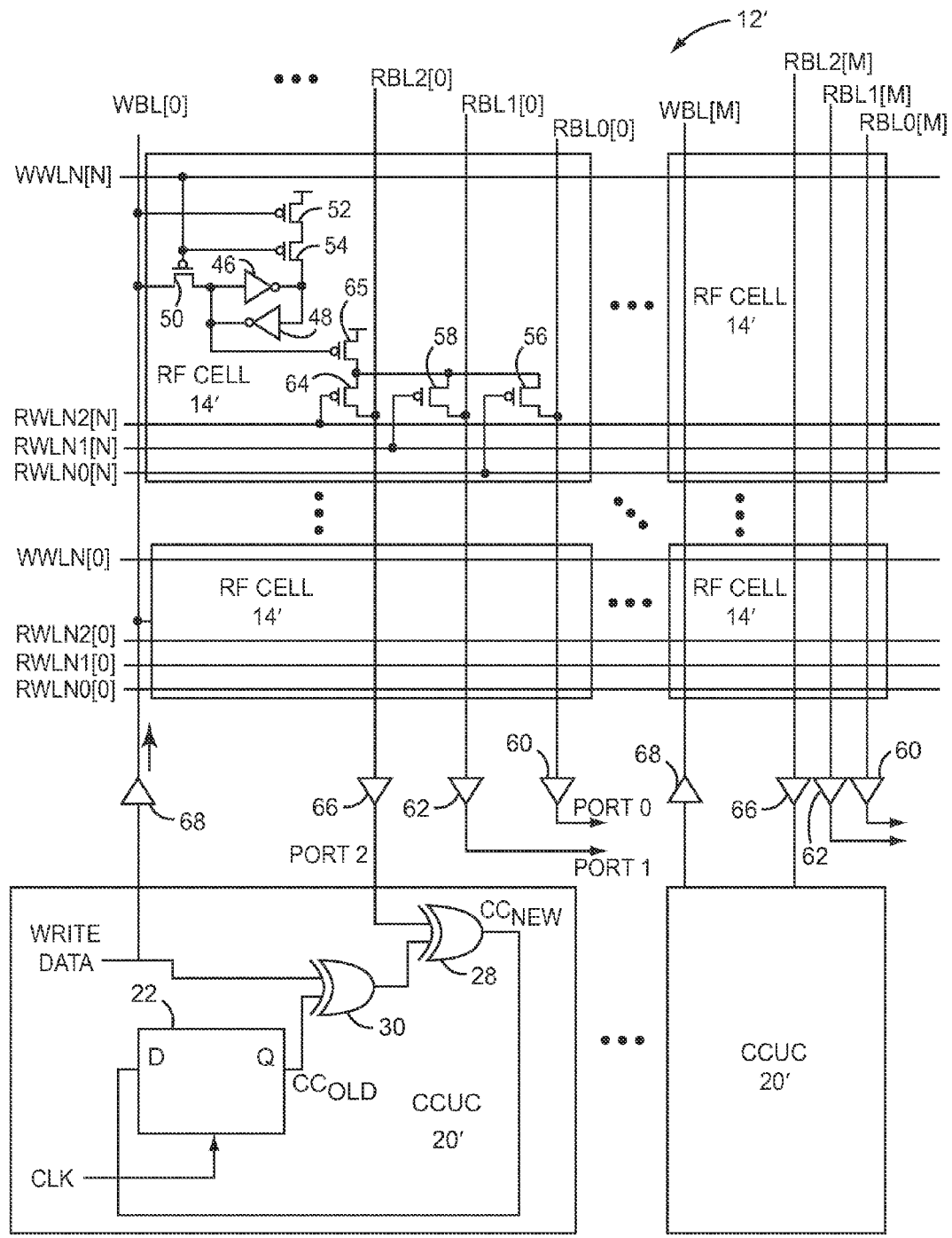

FIG. 14 illustrates a register file cell array in association with column check bit and update circuitry according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
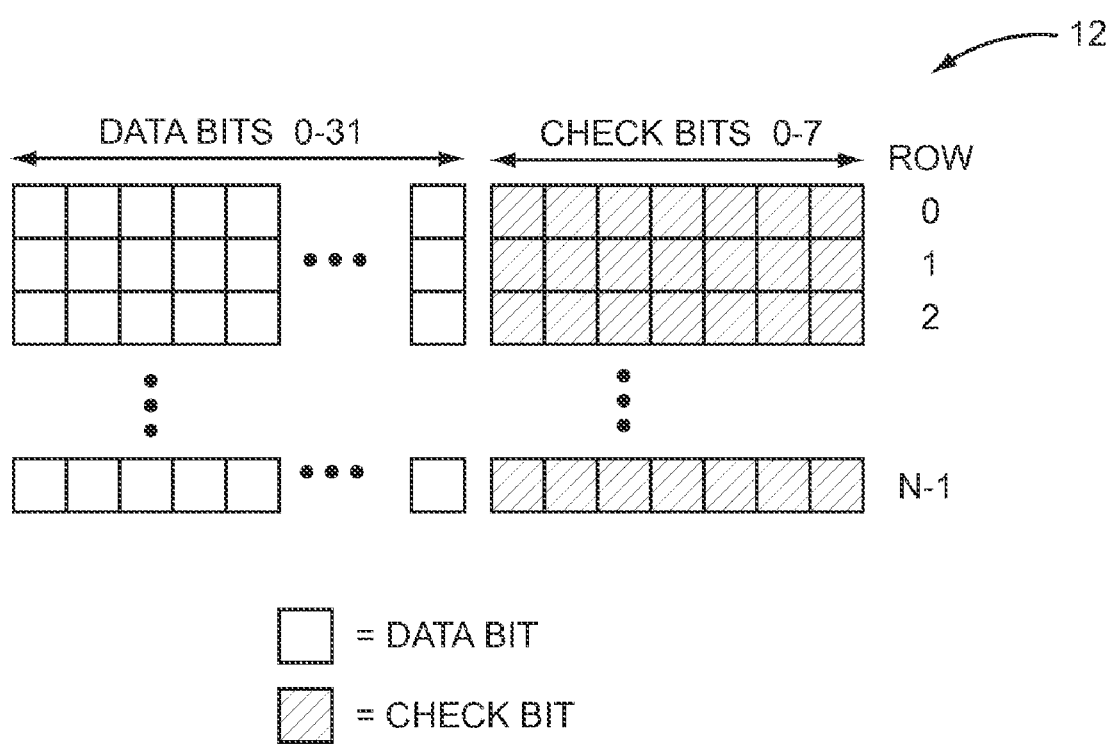
FIG. 1 illustrates a memory array employing conventional error detection and correction techniques according to the prior art.
Figure 2:
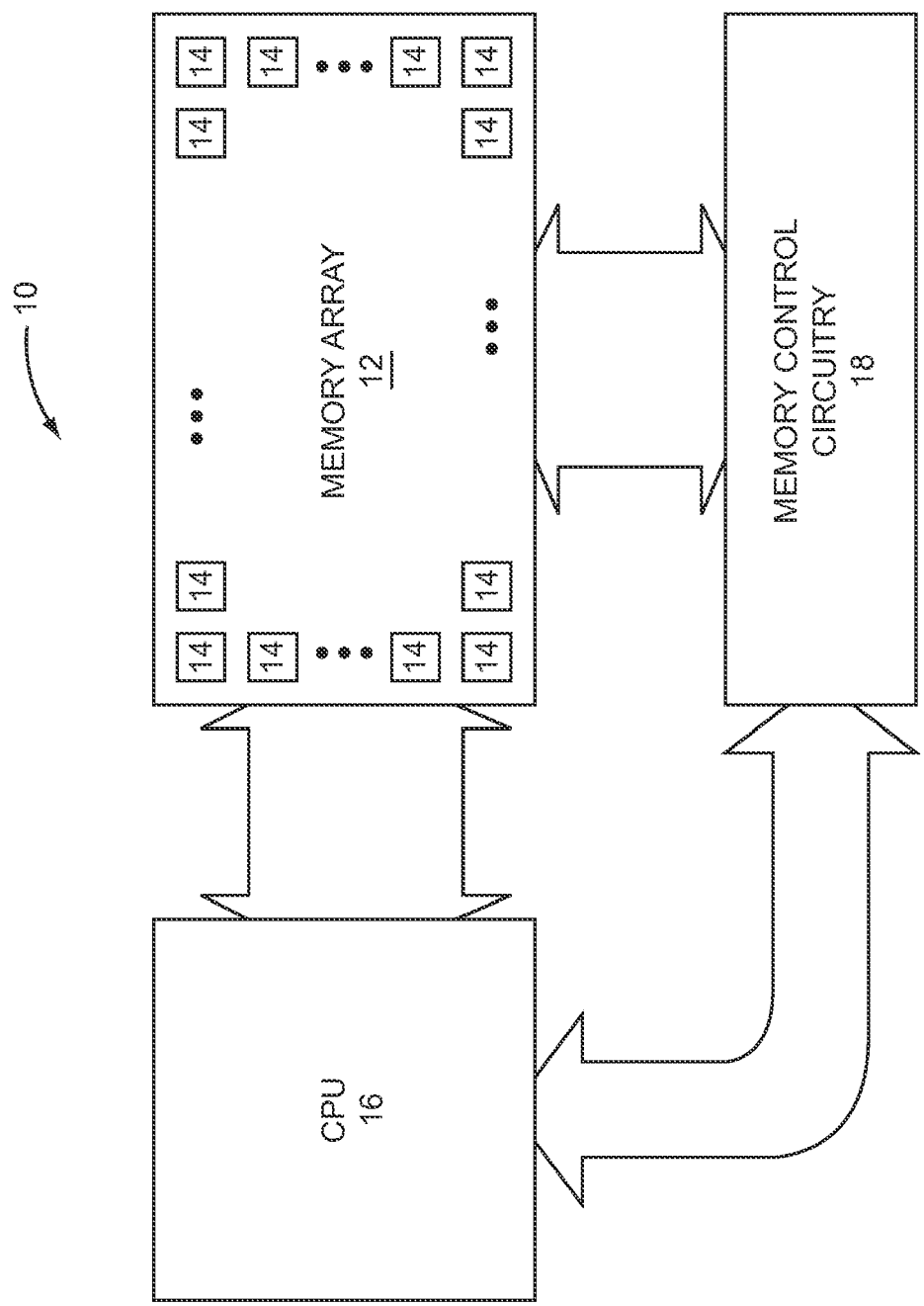
FIG. 2 is a block representation of a processing system according to one embodiment of the present invention.

Prior to delving into the details of various embodiments of the present invention, attention is drawn to FIG. 2, which illustrates a basic processing architecture 10 in which the concepts of the present invention may be employed. In general, a memory array 12 of any type may comprise an array of individual cells 14, which are substantially aligned on various rows and columns. The individual cells 14 are each configured to store a binary value that is associated with a logical bit. The memory array 12 is associated with a central processing unit (CPU) 16, which may represent a microprocessor or a system including one or more microprocessors. The CPU 16 is configured to read data from and write data to the memory array 12. Notably, the term "data" is defined to encompass traditional data as well as operating instructions, which control operation of the CPU 16. Memory control circuitry 18 is provided to enable the CPU 16 to access the memory array 12 as well as implement certain aspects of the present invention, as will be described below. Notably, the functionality of the memory control circuitry 18 may be provided in separate circuitry or integrated with and distributed among the CPU 16 and the memory array 12.

The present invention is directed to a two-dimensional parity technique for data to be stored in one or more memory arrays 12, each of which has various rows and columns of cells. In normal use, words that are d bits long are written into the array. Each word is broken into to a k bit bundle, wherein for example a 32-bit word (d=32) may have four eight-bit bundles (k=8). Although 32-bit words and byte-sized bundles are used for the examples herein, the words and bundles may be sized in virtually any manner. Bundles of different words are associated with each other in a super bundle. Each bundle represents a row in a super bundle and is referred to as a row bundle. Accordingly, a super bundle includes numerous rows of row bundles, and corresponding bits in each of the row bundles in the super bundle are aligned in k columns.

A row check bit CR is provided for each row bundle in each super bundle. Each row check bit CR provides a parity bit that is derived from the k bits of the corresponding row bundle. In one embodiment, the row check bit CR is derived from taking the logical exclusive-OR (XOR) of each of the bits in the corresponding row bundle. As such, each row check bit $CR_{ROW,SB}$ for a given row, ROW, in a given super bundle, SB, can be calculated as follows:

$$CR_{ROW,SB} = b0_{ROW,SB} \text{ XOR } b1_{ROW,SB}$$
$$\text{XOR } b2_{ROW,SB} \text{ XOR } \ldots bi_{ROW,SB} \text{ for } i=k-1,$$

wherein k is the number of bits in the row bundle.

A column check bit CC is provided for each column in each super bundle. Each column check bit CC provides a parity bit that is derived from each of the bits in the corresponding column in the super bundle. As such, each column check bit is based on a corresponding bit from the different row bundles in the super bundle. In one embodiment, the column check bit CR is derived from taking the exclusive-OR of each of the bits in the corresponding column. As such, the column check bits $CC_{COL,SB}$ for a given column, COL, in a given super bundle SB can be calculated as follows:

$$CC_{COL,SB} = bi_{0,SB} \text{ XOR } bi_{1,SB} \text{ XOR } bi_{2,SB}$$
$$\text{XOR } \ldots bi_{ROW,SB}, \text{ for ROW}=N-1$$

wherein N is the number of rows in the super bundle SB, i identifies a corresponding bit in each of the row bundles in the super bundle, and bit bi corresponds to a column, COL. The various bits in the super bundles are mapped to the cells of the memory array. The row check bits CR and the column check bits CC are mapped to cells in the same or different memory array.

Figure 3A:
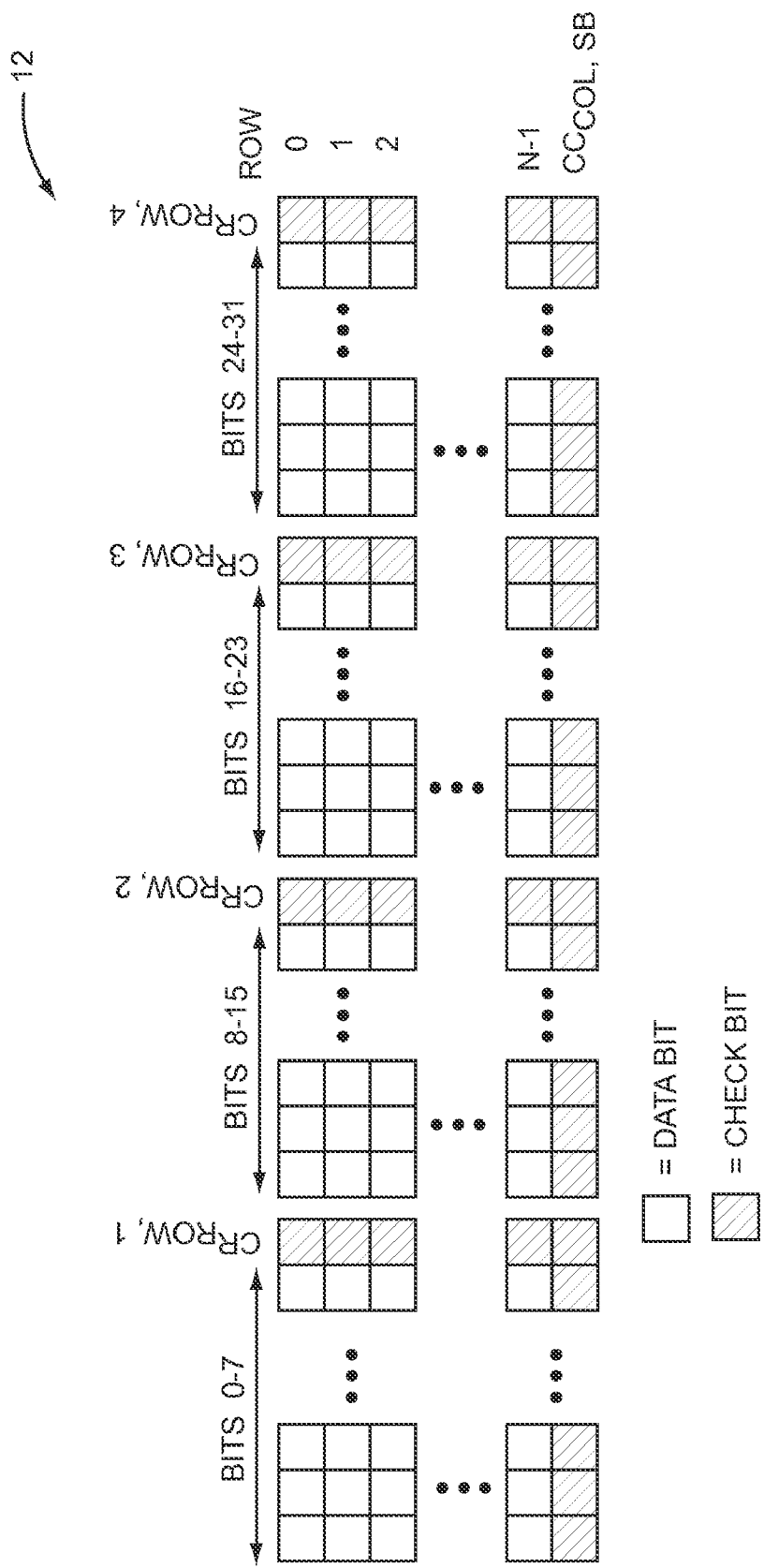
FIGS. 3A and 3B illustrate a memory array employing error detection and correction techniques according to one embodiment of the present invention.

With reference to FIG. 3A, an N×32 cell memory array is shown to illustrate a two-dimensional parity scheme according to one embodiment of the present invention. Assume the row check bits CR and the column check bits CC are stored in a separate memory array, but are interwoven about the different super bundles in a logical fashion to show their relationship with the corresponding row bundles and columns of the super bundles. Further assume that a 32-bit word (d=32) is written across each row of the memory array. Each 32-bit word is broken into four eight-bit row bundles (k=8). As such, each word is represented by a first row bundle for bits 0 through 7, a second row bundle for bits 8 through 15, a third row bundle for bits 16 through 23, and a fourth row bundle for bits 24 through 31. The first row bundles for each of the N words form a first super bundle; the second row bundles for each of the words form a second super bundle; the third row bundles for each of the words form a third super bundle; and the fourth row bundles for each of the words form a fourth super bundle.

Each row bundle in each of the super bundles is associated with a row check bit $CR_{ROW,SB}$, wherein ROW identifies the row in the super bundle in which the corresponding row bundle resides and SB identifies the super bundle. Each column in each of the super bundles is associated with a column check bit $CC_{COL,SB}$, wherein COL identifies the column in the super bundle and SB identifies the super bundle. Notably, column check bits $CC_{COL,SB}$ may be provided for the row check bits $CR_{ROW,SB}$, in each of the super bundles, SB, as illustrated.

Figure 3B:
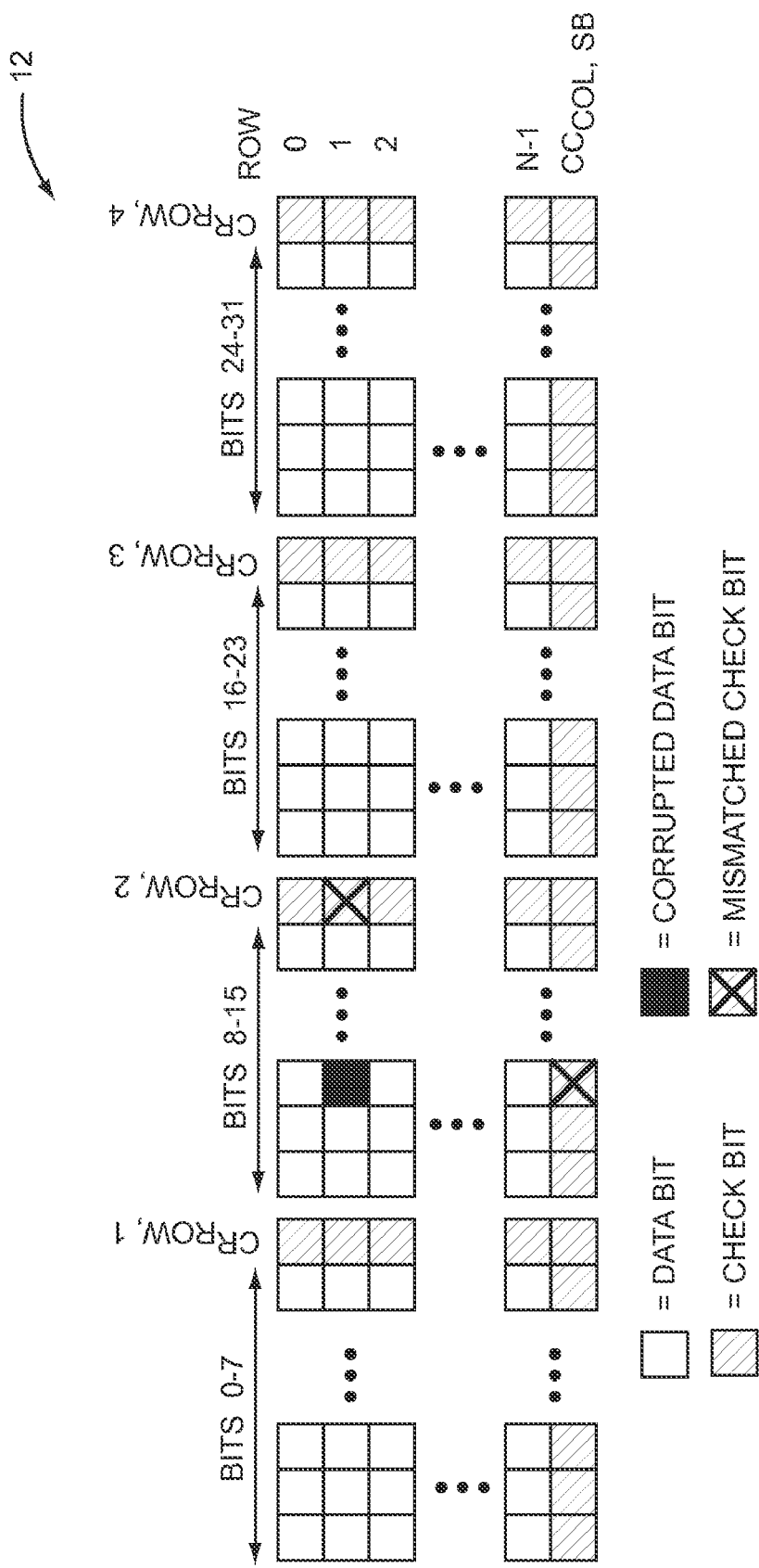

Turning now to FIG. 3B, assume that bit 10 of the overall word in row 1 is corrupted and that bit 10 resides in a row bundle on row 1 of the second super bundle. For clarity, even though bit 10 is the third bit in the row bundle, it will be referred to as bit 10 when discussing its relative position in the row bundle or actual position in the word. Further, the corresponding column in the super bundle will be referenced with respect to bit 10. As such, the second super bundle (SB=2) that is associated with bits 8 through 15 will have column check bits $CC_{8,2}$ through $CC_{15,2}$, and perhaps another column check bit $CC_{COL,SB}$ for the row check bits $CR_{ROW,SB}$ of the super bundle.

Since bit 10 is corrupted in this example, both the corresponding row check bit $CR_{1,2}$ and the corresponding column check bit $CC_{10,2}$ are mismatched. The integrity of the row bundle can be checked by calculating a temporary row check bit value based on the value for the bits of the row bundle, and comparing the temporary row check bit value with the actual value stored in the row check bit $CR_{1,2}$. If there is a mismatch, the row bundle has an error; however, the comparison of the temporary row check bit value and the actual row check bit value will not identify the specific bit (bit 10) in the row bundle that is corrupted. The corrupted bit can be identified by analyzing the column check bits CR of the second super bundle. For instance, temporary column check bit values may be calculated for each column in the super bundle. Each temporary column check bit value is calculated based on taking the value for the bits in the corresponding column and comparing the temporary column check bit value with the actual value stored in the column check bit CC for that column. The column where the temporary check bit value does not match the actual value of the column check bit CC will identify the specific bit that is corrupted in the row bundle.

Figure 4:
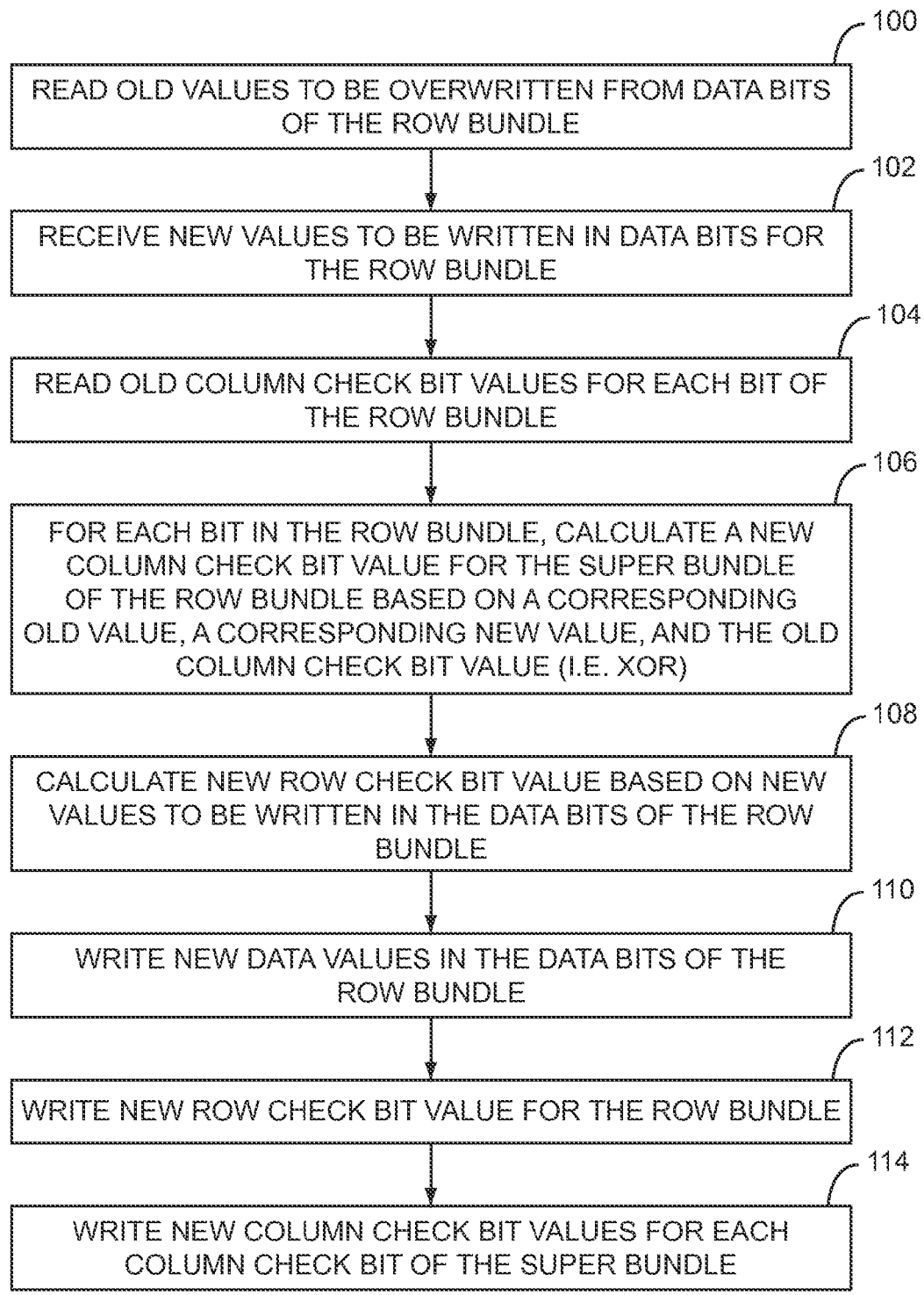
FIG. 4 is a flow diagram illustrating a write operation according to one embodiment of the present invention.
Figure 5:
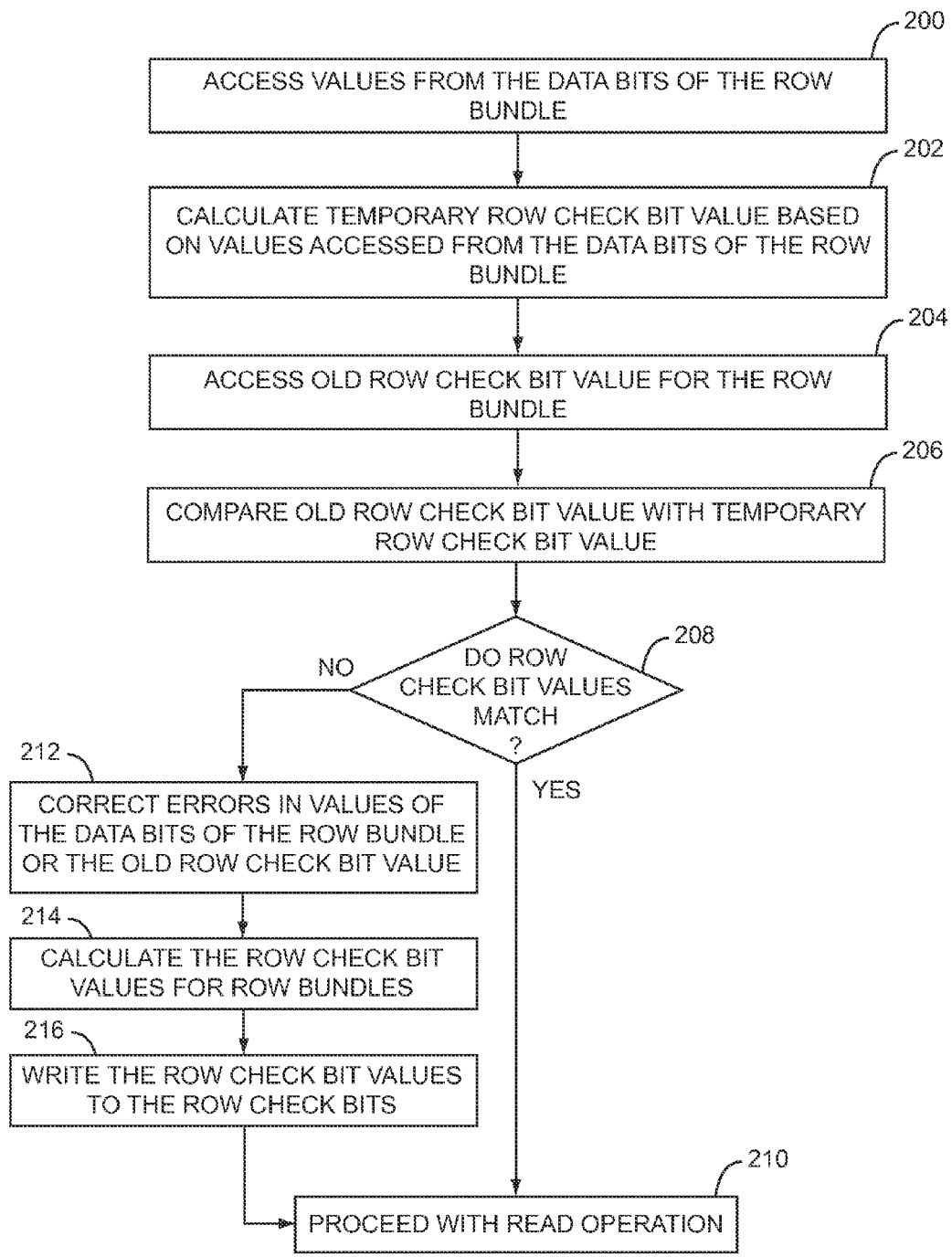
FIG. 5 is a flow diagram illustrating a read operation according to one embodiment of the present invention.
Figure 6:
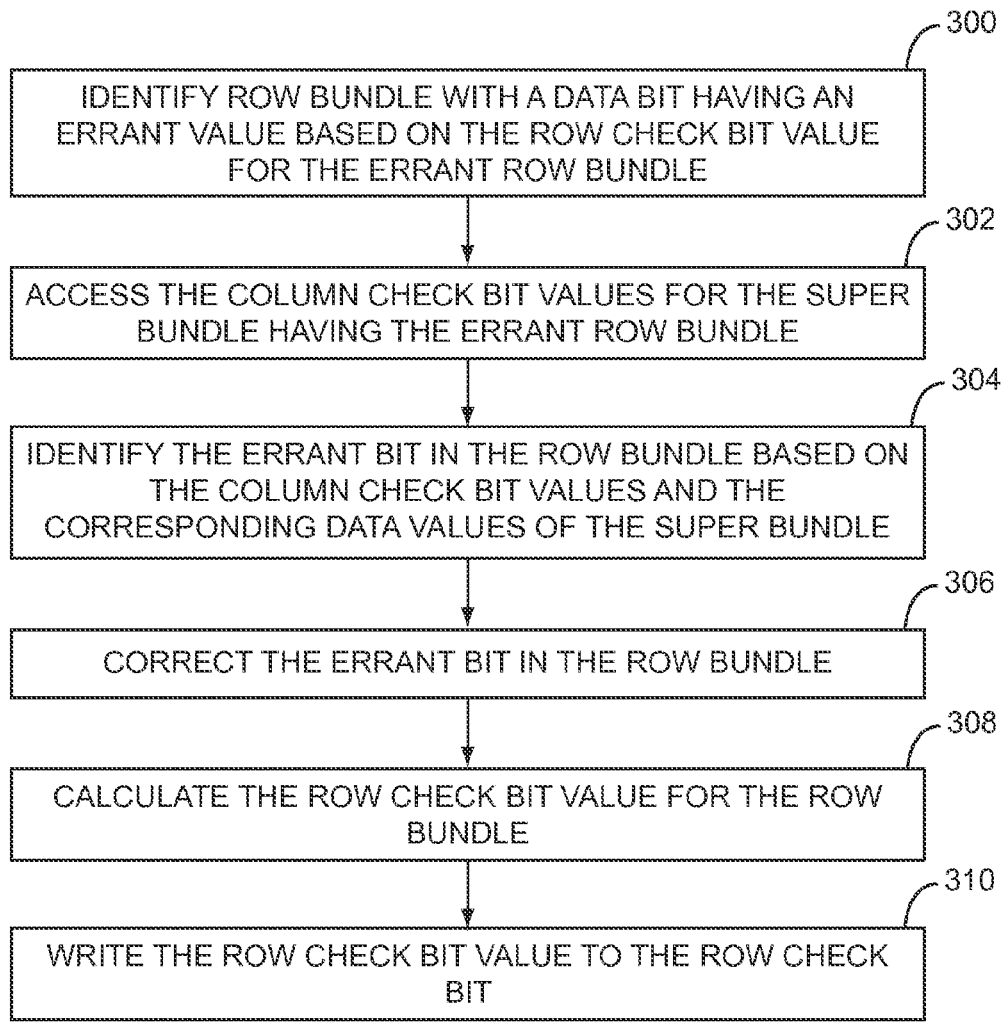
FIG. 6 is a flow diagram illustrating a basic error correction process according to one embodiment of the present invention.

The following Figures, FIGS. 4, 5, and 6, provide flow diagrams illustrating exemplary write, read, and error correction processes, respectively, according to exemplary embodiments of the present invention. With particular reference to FIG. 4, an exemplary write process is described. Prior to writing particular data to the memory array 12, each cell 14 in the memory array 12 is preferably initialized to a known state. Accordingly, all data bits in corresponding row and column check bits, CR and CC, respectively, may be set to a logic 0 or a logic 1. In this initialized state, each of the row check bits CR for the various row bundles and each of the column check bits CC for the columns of the super bundles are proper for the initialized state of the data bits.

Notably, the present invention supports narrow writes, wherein a byte, or like smaller group of bits, in an overall word may be written without having to write the entire word. The following example assumes that each row bundle corresponds to an 8-bit byte, and illustrates the writing of data to a particular row bundle. The data bits of the row bundle are associated with an overall word, wherein each row bundle is provided in a different super bundle. For the write operation, the process begins by reading the old values to be overwritten from the data bits of the row bundle (step 100). The new values to be written into the data bits for the row bundle are received (step 102). Next, the old column check bit values for each bit of the row bundle are read from the corresponding column check bits CC (step 104). For each bit in the row bundle, a new column check bit value is calculated for the super bundle in which the row bundle resides (step 106). As noted above, the new column check bit value may be calculated based on the old values of the data bits to be overwritten, the new values for the data bits to be overwritten, and the old column check bit value. In a preferred embodiment, the new column check bit value is calculated by taking the exclusive-OR of these three values, wherein:

$$CC_{NEW} = b_{OLD} XOR\ b_{NEW} XOR\ CC_{OLD},$$

wherein $b_{OLD}$ represents the old value of the data bit to be overwritten by $b_{NEW}$ and $CC_{OLD}$ represents the old column check bit value to be overwritten by new column check bit value $CC_{NEW}$.

Next, a new row check bit value is calculated based on the new values to be written in the data bits of the row bundle (step 108). The new row check bit value may be calculated, as described above, by taking the exclusive-OR of the new values to be written in the data bits of the row bundle. The new values are written in the data bits of the row bundle (step 110) and the new row check bit value for the row bundle is written into the corresponding row check bit $CR_{ROW,SB}$ (step 112). Finally, the new column check bit values for each column check bit of the super bundle in which the row bundle resides are written into the corresponding column check bits $CC_{COL,SB}$ (step 114). It should be noted that variations from this order may result in correct functionality and that many of the steps may be performed concurrently, depending upon the circuitry employed.

With reference to FIG. 5, an exemplary read process is described according to one embodiment of the present invention. For the row bundle to be read, the values from the data bits of the row bundle are initially accessed (step 200). A temporary row check bit value is calculated based on the values accessed from the data bits of the row bundle (step 202). Next, the old row check bit value for the row bundle is retrieved from the corresponding row check bit $CR_{ROW,SB}$ (step 204) and compared with the temporary row check bit value (step 206). If the old and temporary row check bit values match (step 208), the read operation proceeds in normal fashion (step 210), because the values from the data bits of the row bundle are assumed to be uncorrupted.

If the old and temporary row check bit values do not match (step 208), the errors in the values of the data bits of the row bundle are identified and corrected (step 212). Notably, this process may allow the identification and correction of errors that occur in the value of the check bit $CR_{ROW,SB}$, assuming the values of the data bits of the corresponding row bundle are accurate. Continuing with the flow, the row check bit values for the row bundles are recalculated (step 214) and are written to the corresponding row check bits $CR_{ROW,SB}$ (step 216). Once the values of the data bits of the row bundle are corrected, the read operation can proceed in traditional fashion (step 210).

With reference to FIG. 6, a high-level error correction process is provided according to one embodiment of the present invention. After the high-level overview of the error correction process, a more detailed error correction process is provided according to one embodiment of the present invention. With particular reference to FIG. 6, an error correction process proceeds as follows. Initially, a row bundle with a data bit having an errant value is identified based on the row check bit value for the errant row bundle (step 300). The column check bit values for the super bundle having the errant row bundle are then accessed (step 302). The errant bit in the row bundle is identified based on the column check-bit values and the corresponding data values of the super bundle (step 304). In one embodiment, the column check bit values are recalculated for the super bundle and compared with the original column check bit values. A mismatch in the recalculated and original column check bit values points to the column, and thus the errant bit in the row bundle. The errant bit is corrected in the row bundle, assuming there is no more than one errant bit (step 306), and the row check bit value for the row bundle is recalculated (step 308). Finally, the row check bit value is written to the corresponding row check bit (step 310).

With reference to FIGS. 7A-7C, a more detailed correction process is provided according to a preferred embodiment of the present invention. The process is described in association with a representative super bundle, such as that illustrated in FIG. 8. Initially, the row bundle with a data bit having an errant value is identified based on the row check bit value for the errant row bundle (step 400). In this example, the row bundle corresponds to row 1 of the super bundle illustrated in FIG. 8. In the row bundle, bit 1 is the errant bit, and has a value of 1. The corresponding value of the row check bit $CR_{ROW}$ is a logic 0. The column check bit values for the super bundle are accessed (step 402) and stored in a temporary memory location (step 404). The column check bit values stored in a temporary memory location are referred to as temporary check bit values.

Next, an iterative process is provided wherein the temporary check bit values are exclusive-ORed with the data bit values of the first row bundle of the super bundle. The result is stored as the temporary check bit values in the temporary memory location. This process is repeated for each row bundle of the super bundle as follows. Initially, the data bit values for the first row bundle of the super bundle are set as the current data bit values (step 406), and exclusive-ORed with the temporary check bit values (step 408). For this first exclusive-OR operation, the temporary check bit values correspond to the column check bit values. The result of the exclusive-OR of the current data bit values and the temporary check bit values is stored as the temporary check bit values in the temporary memory location (step 410). If there are more row bundles of the super bundle to process (step 412), the next row bundle of the super bundle is selected (step 414). The data bit values for the next row bundle of the super bundle are set as the current data bit values (step 416), and the process repeats until each of the row bundles of the super bundle have been processed, and effectively exclusive-ORed with each other and the column check bit values for the super bundle. These steps are represented as follows:

Step 1: TEMP=CC=0000
    Step 2: TEMP=TEMP XOR ROW 0=0000
    Step 3: TEMP=TEMP XOR ROW 1=0100
    Step 4: TEMP=TEMP XOR ROW 2=0100
    Step 5: TEMP=TEMP XOR ROW 3=0100
    Once all of the row bundles in the super bundle have been processed (step 412), the resultant temporary check bit values are set as syndrome values (step 418).
    Step 6: SYNDROME=TEMP=0100

The syndrome values are then analyzed to detect the errant bit in the errant super bundle (step 420). In this example, the bit that is a logic 1 in the syndrome corresponds to the errant bit in the errant row bundle. At this point, the errant bit in the errant row bundle has been identified. To correct the errant bit value in the errant row bundle, the errant bit value is exclusive-ORed with the value of the corresponding bit in the syndrome (step 422). The result of the exclusive-OR is the corrected bit value for the errant bit in the errant row bundle.

The corrected bit value for the errant bit is written into its appropriate location (step 424). At this point, the values of the data bits in the row bundle are correct, and a new row check bit value is calculated for the row bundle (step 426) and written into the corresponding row check bit $CR_{ROW,SB}$ (step 428). The recalculation of the row check bit $CR_{ROW,SB}$ is provided in case the error was actually in the row check bit $CR_{ROW,SB}$ itself. If desired, the row check bit values for each of the row bundles may be calculated. In the above examples, the rows and columns of a super bundle basically aligned with actual rows and columns of the memory array 12. As such, there was a substantially direct mapping of data bits in a super bundle to corresponding cells 14 in the memory array 12. In such a configuration, the memory array 12 is not substantially radiation hardened. In other words, when an ionizing radiation particle strikes an affected cell 14, the adjacent cells 14 may also be affected. If the strike causes two adjacent cells in a row bundle to change states, the error correction scheme described above may not be able to correct the errors. This condition may be detected by multiple row or column check bits for a single super bundle being found to be inconsistent with the stored data during the correction procedure outlined above. Consequently, bits in a super bundle should not be stored in physically adjacent memory cells.

To provide significant radiation hardening, the bits in different super bundles are interleaved with one another in the actual memory array 12. In one embodiment, adjacent bits in each row bundle of a given super bundle are mapped to cells 14 in the memory array 12 such that the adjacent bits in each row bundle are separated by a bit from another super bundle. Preferably, adjacent bits in each column of the given super bundle are also mapped to cells 14 in the memory array 12 such that the adjacent bits in each column are separated by a bit from another super bundle.

An exemplary mapping scheme is illustrated in FIG. 9A. In particular, the memory array 12 has N rows and 64 columns, where one-half of the memory array 12 is not illustrated. The leftmost section, like the other sections, has N rows and 16 columns, wherein each pair of columns is designated as an SB column k, and each pair of rows is designed as an SB row. The leftmost section of the illustrated memory array supports four super bundles, wherein bits for the respective super bundles are referenced as a, b, c, and d. Each of the other sections of the array may also support four super bundles, wherein the row bundles for a word may be written in different super bundles in the different sections. As illustrated for the leftmost section, no bits for a given super bundle are adjacent to one another along a row or column. As such, a radiation strike that affects adjacent cells 14 in the memory array 12 will not affect adjacent bits in the same super bundle.

In particular, the first row bundle of the first super bundle (a) is mapped to cells 0, 2, 4, 6, 8, 10, 12, and 14 of row 0 of the memory array 12. The first row bundle of the second super bundle (b) is mapped to cells 1, 3, 5, 7, 9, 11, and 15 of row 0 of the memory array 12. The first row bundle of the third super bundle (c) is mapped to cells 0, 2, 4, 6, 8, 10, 12, and 14 of row 1 of the memory array 12. The first row bundle of the fourth super bundle (d) is mapped to cells 1, 3, 5, 7, 9, 11, and 15 of row 1 of the memory array 12. Moving down the section, the remaining row bundles of the first and second super bundles (a, b) are mapped to rows 2, 4, 6 ... N−2, while the remaining row bundles of the third and fourth super bundles are mapped to rows 3, 5, 7, . . . N−1. In this example, the corresponding row and column check bits CR, CC for the row bundles and columns of the different super bundles are logically illustrated and stored in another memory array in a similar interleaved fashion. Although each section is illustrated to provide four interleaved super bundles, any number of super bundles may be interleaved in a variety of ways, as will be appreciated by those skilled in the art.

As will be described below in further detail, column check bit update circuitry (CCUC) 20 may be associated with an SB column, which represents a logic column that is shared by a group of interleaved super bundles. In other words, corresponding columns in each of the interleaved super bundles are associated with a given SB column. For example, column 0 for each of the four interleaved super bundles in FIG. 9A will correspond to each other and are associated with SB column 0, and so on and so forth. The CCUC 20 may be configured to update the value of the corresponding column check bit $CC_{COL,SB}$ when data is written to one of the row bundles in the super bundle. The inclusion of the CCUCs 20 in FIGS. 9A and 9B is provide to show the relationship of the CCUCs 20 with the corresponding columns in the interleaved super bundles.

With reference to FIG. 9B, a corrupted bit is illustrated. The corrupted bit is bit 0 of the first row bundle in the fourth super bundle (d). Bit 0 is in column 0 of the fourth super bundle and column 1 of the memory array 12. The corresponding row check bit $CR_{1,d}$ and column check bit $CC_{1,d}$ are highlighted. As described above, these check bits are used to first identify the row bundle that has the error and then identify the errant bit in the errant row bundle. If a radiation strike caused this bit error, there is little likelihood of the strike causing further damage to bits in the fourth super bundle (d), because there is at least one bit from the other super bundles that separates the errant bit from other bits in the fourth super bundle (d).

Turning now to FIG. 10, an exemplary CCUC 20 is illustrated according to one embodiment of the present invention. Notably, the CCUC 20 is illustrated as being logically connected to a single static random access memory (SRAM) cell 14 of the memory array 12. The circuitry used to selectively couple the CCUC circuitry to the various bits in the column of the super bit supported by the CCUC 20 is not shown for clarity. Those skilled in the art should recognize that various configurations are available for dynamically coupling the CCUC 20 to an appropriate SRAM cell 14. In traditional SRAM fashion, the output of the SRAM cell 14 is a differential output, which is represented by bit line (BL) and bit line not (BLN).

In this embodiment, a key function of the CCUC 20 is to provide a memory location for storing the corresponding column check bit $CC_{COL,SB}$ for the corresponding column. In this embodiment, the column check bit value is stored in a D-type flip-flop 22, which is driven by a clock signal (CLK). When a write line WL[X] corresponding to the SRAM cell 14 is active, a signal representative of the logic state stored by the SRAM cell 14 is provided in differential form on lines BL and BLN. Lines BL and BLN are coupled to isolation and hold circuitry 24, which will read lines BL and BLN and present the signal to the input of a differential sense amplifier 26. When enabled, the output of the sense amplifier 26 ($SA_{OUT}$) represents the value stored in the SRAM cell 14. The output of the sense amplifier 26 is presented to a first input of an exclusive-OR gate 28.

When data is being written to the SRAM cell 14, the value to be written (WRITE DATA) is presented to a first input of an exclusive-OR gate 30 at the same time as the flip-flop 22 is providing the value for the old column check bit $CC_{OLD}$ to the second input of the exclusive-OR gate 30. As such, the exclusive-OR gate 30 provides an exclusive-OR of the value of the bit to be written in the SRAM cell 14 and the value of the old column check bit $CC_{OLD}$. The output of the exclusive-OR gate 30 is provided to the second input of the exclusive-OR gate 28. As such, the value that was read from the SRAM cell 14 is exclusive-ORed with the output of the exclusive-OR gate 30. The output of the exclusive-OR gate 28 represents the value for the new column check bit $CC_{NEW}$, which is provided to the input of the flip-flop 22. The new value for the column check bit $CC_{NEW}$ is stored in the flip-flop 22 when the clock signal CLK becomes active. In essence, this portion of the CCUC 20 calculates a new value for the column check bit $CC_{NEW}$ for a write operation. As described above, the new value for the column check bit $CC_{NEW}$ is provided by exclusive-ORing the values for each bit in the column of the super bundle. Thus, at any given time, the current value of the column check bit $CC_{OLD}$ represents the result of exclusive-ORing each of the bits in the column of the super bundle. As such, when a single bit in a column changes, such as when data is written to a row bundle, the exclusive-OR of each of the bits in the column does not need to be recalculated. It is sufficient to take the exclusive-OR of the old value of the column check bit, the value of the bit to be overwritten, and the value of the bit to be written to determine the new column check bit value.

With continued reference to FIG. 10, as the new column check bit value is being calculated, the CCUC 20 facilitates the writing of the write data to the SRAM cell 14. As indicated, the old value that was stored in the SRAM cell 14 is read and used to calculate the new column check bit value. While the new column check bit value is being calculated, the hold circuitry 24 will isolate the lines BL and BLN from the sense amplifier 26, while continuing to present the value that was read from the SRAM cell 14 to the differential inputs of the sense amplifier 26. Accordingly, lines BL and BLN are available to be presented a differential version of the write data.

A sense amplifier enable signal (SAE), which is used to activate the sense amplifier 26, is delayed through a delay circuit 32, which instructs the isolation and hold circuitry 24 to isolate lines BL and BLN from the sense amplifier 26 as well as enable inverters 34 and 36. Together with inverter 38, inverters 34 and 36 present a differential signal representing the write data to the respective lines BL and BLN to effectively write data to the SRAM cell 14.

A timing diagram illustrating operation of the CCUC 20 is provided in FIG. 11. In essence, when the write line WL[X] is active, the value stored in the SRAM cell 14 is presented on lines BL and BLN. The sense amplifier enable signal SAE becomes active and activates the sense amplifier 26, which is receiving the value being read from the SRAM cell 14. The output of the sense amplifier 26 $SA_{OUT}$ is provided to the first input of the exclusive-OR gate 28 to enable calculation of the new column check bit value $CC_{NEW}$.

After the delay provided by the delay circuitry 32, a write enable signal (WE) provided by the output of the delay circuitry 32 triggers the isolation and hold circuitry 24 to isolate the lines BL and BLN as well as enable the inverters 34 and 36. At this point, the differential version of the write data is presented on lines BL and BLN, which will effectively set the SRAM cell 14 to the corresponding value of the write data. On the next clock cycle, the new column check bit value is clocked into the flip-flop 22 and will become the old column check bit value for the next write cycle.

With reference to FIGS. 12A and 12B, another embodiment of the present invention is illustrated. In particular, a radiation-hardened memory array 12 is depicted, wherein four super bundles are interleaved in much the same fashion as that illustrated in FIGS. 9A and 9B. Accordingly, first, second, third, and fourth super bundles (a, b, c, and d) have corresponding bits that are interleaved such that adjacent bits in any given super bundle are separated from each other by at least one bit from another super bundle. As described above, the corresponding columns of the different super bundles may be associated with a single CCUC 20. Accordingly, the CCUC 20 that is illustrated in FIG. 10 has been modified to provide four memory locations. Each memory location is for storing a column check bit value for each of the corresponding columns of the different super bundles. As illustrated, the CCUC 20 is associated with SB column 0. Accordingly, a first flip-flop 22 is used to store a column check bit value for column 0 of the first super bundle (a); a second flip-flop 22 is used to store a column check bit value for column 0 of the second super bundle (b); a third flip-flop 22 is used to store a column check bit value for column 0 of the third super bundle (c); and a fourth flip-flop 22 is used to store a column check bit value for column 0 of the fourth super bundle (d). A similar CCUC 20 is provided for each SB column in the memory array.

Multiplexer circuitry (MUX) 40 and de-multiplexer circuitry (DEMUX) 42 or the like may be used to select the appropriate flip-flop 22, based on the super bundle being processed. As illustrated, a super bundle select signal ($SB_{SEL}$) or the like may be used to control the multiplexer and de-multiplexer circuitries 40, 42. Further, column routing circuitry 18A may be used to route the appropriate columns of the memory array 12 to the appropriate CCUCs 20 based on a column select signal $COL_{SEL}$ or the like. Assuming the memory array 12 is an SRAM array, row selection circuitry 18B may be responsive to a row selection signal $ROW_{SEL}$ or the like to effectively map write lines to the appropriate rows in the memory array 12 for memory reads and writes. The row selection circuitry 18B and the column routing circuitry 18A may be part of the memory control circuitry 18, the memory array 12, the CPU 16, or other circuitry associated therewith. A notable feature of this embodiment is the ability for a single CCUC 20 to store and support the updating of multiple column check bits $CC_{COL,SB}$ for different super bundles. For SRAM embodiments, a single sense amplifier 26 may be used in each CCUC 20.

With reference to FIG. 13, different memory arrays 12A and 12B are illustrated. To facilitate radiation hardening, as well as being able to read or write data with its associated row and column check bits $CR_{ROW,SB}$ and $CC_{COL,SB}$, the row and column check bits $CR_{ROW,SB}$ and $CC_{COL,SB}$ may be stored in a different memory array 12 than the associated data. As illustrated, data 0 is stored in memory array 12A, while the associated row and column check bits $CR_{DATA0}$ and $CC_{DATA0}$ are stored in memory array 12B. Similarly, data 1 is stored in memory array 12B, while the associated row and column check bits $CR_{DATA1}$ and $CC_{DATA1}$ are stored in memory array 12A. By separating the data and corresponding row and column check bits $CR_{ROW,SB}$ and $CC_{COL,SB}$, the data values and the check bit values may be read or written at substantially the same time. Without separating the data bits from the row and column check bits $CR_{ROW,SB}$ and $CC_{COL,SB}$, it may not be possible to read or write the respective information, or it may not be possible read or write the information at the same time.

Although the above examples have been focused on SRAM configurations for the memory array 12, the memory array 12 may take any form and may be created using any type of memory technology. An exemplary alternative is a register file array 12' comprised of register file (RF) cells 14', such as that illustrated in FIG. 14. In essence, a typical register file configuration is provided and associated with a modified CCUC 20'. In this example, each register file cell 14' includes one write port and three read ports, which are associated with a pair of cross-coupled inverters 46, 48. The write port is provided by PMOS transistors 50, 52, and 54. The two conventional read ports are provided by PMOS transistors 56 and 58, each of which drives a separate data port, port 0 and port 1, through read buffers 60 and 62, respectively. Unique to the present invention is the addition of the third read port, which is provided by PMOS transistor 64, which along with PMOS transistors 56, 58 is coupled to the cross-coupled inverters 46, 48 via transistor 65. Notably, the third read port provides a direct input to a corresponding CCUC 20' through a read buffer 66. The output of the read buffer 66 represents the third read port (port 2). The output of the read buffer 66 may be provided substantially directly to the first input of the exclusive-OR gate 28, instead of being run through the isolation and hold circuitry 24 and the sense amplifier 26. Further, the write data signal may be provided to a write buffer 68, which drives the write port provided by PMOS transistors 50, 52, and 54.

The exemplary register file 12' allows access to a row of cells, e.g., to row N by asserting the read word line (RWLNx [N]) low, where x indicates the read port. The register file cell is written by asserting the write word line (WWLN[N]) low to place the value on the WBL[y] onto the associated cell via transistors 50, 52, and 54. For example, to read the present value of the bit stored in the bottom row of the register file, RWLN2[0] is driven low by the RWL decoder (not shown) to place the bit value onto the predischarged RBL2[x] read bit lines, which is in turn buffered to read port 2. These read bit lines are either left in their predischarged state or charged via PMOS transistors 64 and 65 depending on the stored bit value. To read the present value, the RWLN2[x] for the desired row x is asserted, the bit value to be replaced is read out on RBL2[n] and the values appear on port 2. Read ports 0 and 1 allow concurrent reads of the same or other rows as needed by the processor, independent of the super-bundle check bit update circuitry. The RWLN2[x] of the row x to be written should be de-asserted before the WWLN[x] is asserted to avoid a race-through condition, as should be evident to those skilled in the art. It should be noted that the access transistors may be NMOS, using precharged read bit lines or other access schemes such as CMOS pass gate logic may also be employed, as well as other single-ended or differential write circuits.

With the addition of the extra port, the value stored in the register file cell 14' may be provided at all three ports, port 0, port 1, and port 2, simultaneously. Accordingly, the value stored in a register file may be provided to other circuitry at the same time it is provided to the corresponding CCUC 20'. As the other circuitry is processing, the CCUC 20' may facilitate a write to the register file cell 14' and calculate a new column check bit value $CC_{NEW}$ as described above. Radiation hardening may be provided as described above, wherein corresponding bits of interleaved super bundles are mapped to the register file cells 14' such that adjacent bits in the super bundle are isolated from one another by bits from other super bundles. Further, the CCUC 20' of FIG. 14 may provide multiple memory locations for storing corresponding column check bit values for the different interleaved super bundles.

Those skilled in the art will recognize improvements and modifications to the preferred embodiments of the present invention. All such improvements and modifications are considered within the scope of the concepts disclosed herein and the claims that follow.

What is claimed is:

1. A system for providing two-dimensional parity to facilitate error detection and correction in a memory array comprising:
a first memory array having a first plurality of cells; and
circuitry associated with the first memory array and adapted to:
store values for bits of a plurality of super bundles in the first plurality of cells, each super bundle of the plurality of super bundles comprising a plurality of row bundles, wherein each row bundle of the plurality of row bundles comprises a row of bits and corresponding bits in each of the plurality of row bundles form a column of bits, and wherein bits for a first group of the plurality of super bundles are interleaved within a first section of the first plurality of cells in the first memory array in a manner where adjacent bits for one of the first group of the plurality of super bundles are separated by at least one bit from another of the first group of the plurality super bundles;
for each row bundle, generate a row check bit value that represents a row parity value for the row of bits associated with the row bundle and store the row check bit value as a row check bit; and
for each column of bits, generate a column check bit value that represents a column parity value for the corresponding bits in each of the plurality of row bundles and store the column check bit value as a column check bit.

2. The system of claim 1 wherein an r bit word that is stored in the first memory array comprises x groups of bits, wherein each of the x groups of bits corresponds to one of the plurality of row bundles and is allocated to a different one of the plurality of super bundles.

3. The system of claim 1 wherein:
bits for a second group of the plurality of super bundles are interleaved within a second section of the first plurality of cells in the first memory array; and
an r bit word that is stored in the first memory array comprises x groups of bits, a first of the x groups of bits corresponds to one of the plurality of row bundles in the first group of the plurality of super bundles and a second of the x groups of bits corresponds to one of the plurality of row bundles in the second group of the plurality of super bundles.

4. The system of claim 1 further comprising a second memory array that is separate from the first memory array and comprising a second plurality of cells, wherein the column check bit values and the row check bit values are stored in the second plurality of cells.

5. The system of claim 4 wherein the circuitry is adapted to read the row of bits for one of the plurality of row bundles from the first memory array and read at least a corresponding one of the row check bit values and the column check bit values for the one of the plurality of row bundles at substantially the same time.

6. The system of claim 1 wherein to write new data to a select row bundle of the plurality of row bundles in a first super bundle of the plurality of super bundles, the circuitry is adapted to:
read old data from the row of bits for the select row bundle;
read the column check bit values for the first super bundle;
for each column of bits in the first super bundle, generate a new column check bit value that represents a new column parity value for the corresponding bits in each of the plurality of row bundles of the first super bundle in light of the new data being written to the select row bundle, and set the new column check bit value as the column check bit value for the column of bits; and store the new data in the row of bits for the select row bundle.

7. The system of claim 6 wherein to generate the new column check bit value for each column of bits in the first super bundle, the circuitry is adapted to provide a logical exclusive-OR of a corresponding one of the check bit values that was read, a corresponding bit of the new data, and a corresponding bit of the old data.

8. The system of claim 6 wherein the circuitry is further adapted to generate a new row check bit value that represents the row parity value for the row of bits associated with the row bundle in light of the new data being written to the select bundle, and set the new row check bit value as a row check bit value for the select row bundle.

9. The system of claim 1 wherein to detect an error in a select row bundle of the plurality of row bundles, the circuitry is further adapted to:

access the row check bit value for the select row bundle;
generate a temporary row check bit value based on values for the row of bits of the select row bundle; and
detect the error when the row check bit value does not match the temporary row check bit value.

10. The system of claim 9 wherein the circuitry is further adapted to identify an errant bit of the row of bits having an errant value based on the column check bit value that corresponds to the errant bit.

11. The system of claim 10 wherein the circuitry is further adapted to change the value of the errant bit of the row bits to correct the error.

12. The system of claim 1 wherein to detect an errant bit in a select row bundle of the plurality of row bundles in a first super bundle of the plurality of super bundles, the circuitry is further adapted to:

for each column of bits, effect a logical exclusive-OR of the column check bit value of the column of bits and a value for each corresponding bit in each of the plurality of row bundles in the first super bundle to provide a bit for a syndrome;
analyze the syndrome to identify the column of bits corresponding to the errant bit; and
correct the value of the errant bit.

13. The system of claim 12 wherein to correct the value of the errant bit, the circuitry is further adapted to effect a logical exclusive-OR of values for each bit of the syndrome and values for each bit of the select row bundle to provide a result, and write the result to the select row bundle.

14. The system of claim 1 wherein for each of the plurality of super bundles, the circuitry is further adapted to generate an additional row check bit value based on each column check bit value of a corresponding one of the plurality of super bundles and store the row check bit value as an additional row check bit.

15. The system of claim 1 wherein for each of the plurality of super bundles, the circuitry is further adapted to generate an additional column check bit value based on each row check bit value of a corresponding one of the plurality of super bundles and store the row check bit value as an additional row check bit.

16. The system of claim 1 wherein the first plurality of cells are random access memory cells.

17. The system of claim 16 wherein each row check bit value and each column check bit value are stored in corresponding flip-flop circuitry.

18. The system of claim 1 wherein the first plurality of cells are register file cells.

19. The system of claim 18 wherein each of a group of the register file cells that is associated with a column of bits comprises at least one data port and at least one error correction port that is selectively coupled to a non-register file memory cell allocated to store the column check bit value for the column of bits.

20. The system of claim 1 wherein an r bit word that is stored in the first memory array comprises x groups of bits, wherein each of the x groups of bits corresponds to one of the plurality of row bundles and is allocated to a different one of the plurality of super bundles, the control system further adapted to:

write data to a select row bundle that corresponds to one of the x groups of bits in the r bit word without writing data to others of the x groups of bits in the r bit word, wherein the select row bundle resides in a select super bundle of the plurality of super bundles;
recalculate and update the column check bit values for select super bundle; and
recalculate and update the row check bit value for the select row bundle.

21. A method for providing two-dimensional parity to facilitate error detection and correction in a memory array comprising:

storing values for bits of a plurality of super bundles in a first plurality of cells in a memory array, each super bundle of the plurality of super bundles comprising a plurality of row bundles, wherein each row bundle of the plurality of row bundles comprises a row of bits and corresponding bits in each of the plurality of row bundles form a column of bits, wherein bits for a first group of the plurality of super bundles are interleaved within a first section of the first plurality of cells in the memory array in a manner where adjacent bits for one of the first group of the plurality of super bundles are separated by at least one bit from another of the first group of the plurality super bundles;
for each row bundle, generating a row check bit value that represents a row parity value for the row of bits associated with the row bundle and storing the row check bit value as a row check bit; and
for each column of bits, generating a column check bit value that represents a column parity value for the corresponding bits in each of the plurality of row bundles and storing the column check bit value as a column check bit.

22. The method of claim 21 wherein an r bit word that is stored in the memory array comprises x groups of bits, wherein each of the x groups of bits corresponds to one of the plurality of row bundles and is allocated to a different one of the plurality of super bundles.

23. The method of claim 21 wherein:

bits for a second group of the plurality of super bundles are interleaved within a second section of the first plurality of cells in the memory array; and
an r bit word that is stored in the first memory array comprises x groups of bits, a first of the x groups of bits corresponds to one of the plurality of row bundles in the first group of the plurality of super bundles and a second of the x groups of bits corresponds to one of the plurality of row bundles in the second group of the plurality of super bundles.

24. The method of claim 21 further comprising a second memory array that is separate from the first memory array and comprising a second plurality of cells, wherein the column check bit values and the row check bit values are stored in the second plurality of cells.

25. The method of claim 21 wherein an r bit word that is stored in the first memory array comprises x groups of bits, wherein each of the x groups of bits corresponds to one of the plurality of row bundles and is allocated to a different one of the plurality of super bundles, the method further comprising:

writing data to a select row bundle that corresponds to one of the x groups of bits in the r bit word without writing data to others of the x groups of bits in the r bit word, wherein the select row bundle resides in a select super bundle of the plurality of super bundles;

recalculating and updating the column check bit values for the select super bundle; and recalculating and updating the row check bit value for the select row bundle.

* * * * *